United States Patent [19]
Tsuchida et al.

[11] Patent Number: 5,289,413
[45] Date of Patent: Feb. 22, 1994

[54] DYNAMIC SEMICONDUCTOR MEMORY DEVICE WITH HIGH-SPEED SERIAL-ACCESSING COLUMN DECODER

[75] Inventors: Kenji Tsuchida; Yohji Watanabe, both of Kawasaki, Japan

[73] Assignee: Kabushiki Kaisha Toshiba, Kawasaki, Japan

[21] Appl. No.: 712,106

[22] Filed: Jun. 7, 1991

[30] Foreign Application Priority Data

Jun. 8, 1990 [JP] Japan .................. 2-148474
Aug. 29, 1990 [JP] Japan .................. 2-225355
Oct. 26, 1990 [JP] Japan .................. 2-287267

[51] Int. Cl.⁵ ............................................. G11C 8/00
[52] U.S. Cl. .......................... 365/189.02; 365/230.02
[58] Field of Search ............. 365/189.02, 210, 230.02, 365/233; 371/10.3

[56] References Cited

U.S. PATENT DOCUMENTS 4,618,947 10/1986 Tran et al.
4,800,530 1/1989 Itoh et al. ........................ 365/233 X
4,899,312 2/1990 Sato ............................. 365/230.02 X

OTHER PUBLICATIONS

IEEE Journal of Solid-State Circuits, vol. 24, No. 4, Aug. 1989, pp. 900–904, K. Numata, et al., "New Nibbled-Page Architecture for High-Density DRAM's".
"A 4-Mbit CMOS SRAM with 8-NS Serial-Access Time"; Hirotada Kuriyama et al.; 1990 Symposium on VLSI Circuits; pp. 51–52.

*Primary Examiner*—Steven Mottola
*Attorney, Agent, or Firm*—Oblon, Spivak, McClelland, Maier & Neustadt

[57] ABSTRACT

A MOS memory device includes an array of rows and columns of memory cells, word lines connected to the rows of memory cells, and a plurality of pairs of bits lines connected to the columns. Sense amplifiers and transfer gates are provided for every bit line pair. A column decoder has outputs connected via column-select lines to transfer gates such that each output is connected to two adjacent gates. When activating a certain column, the column decoder potentially activates another column adjacent to the certain column before actually receiving the corresponding column address. This permits information bits stored in four memory cells to be transferred simultaneously to the registers and latched therein. A multiplexer serially reads out the latched information bits. The column preactivation improves the serial accessing speed of the memory device.

28 Claims, 22 Drawing Sheets

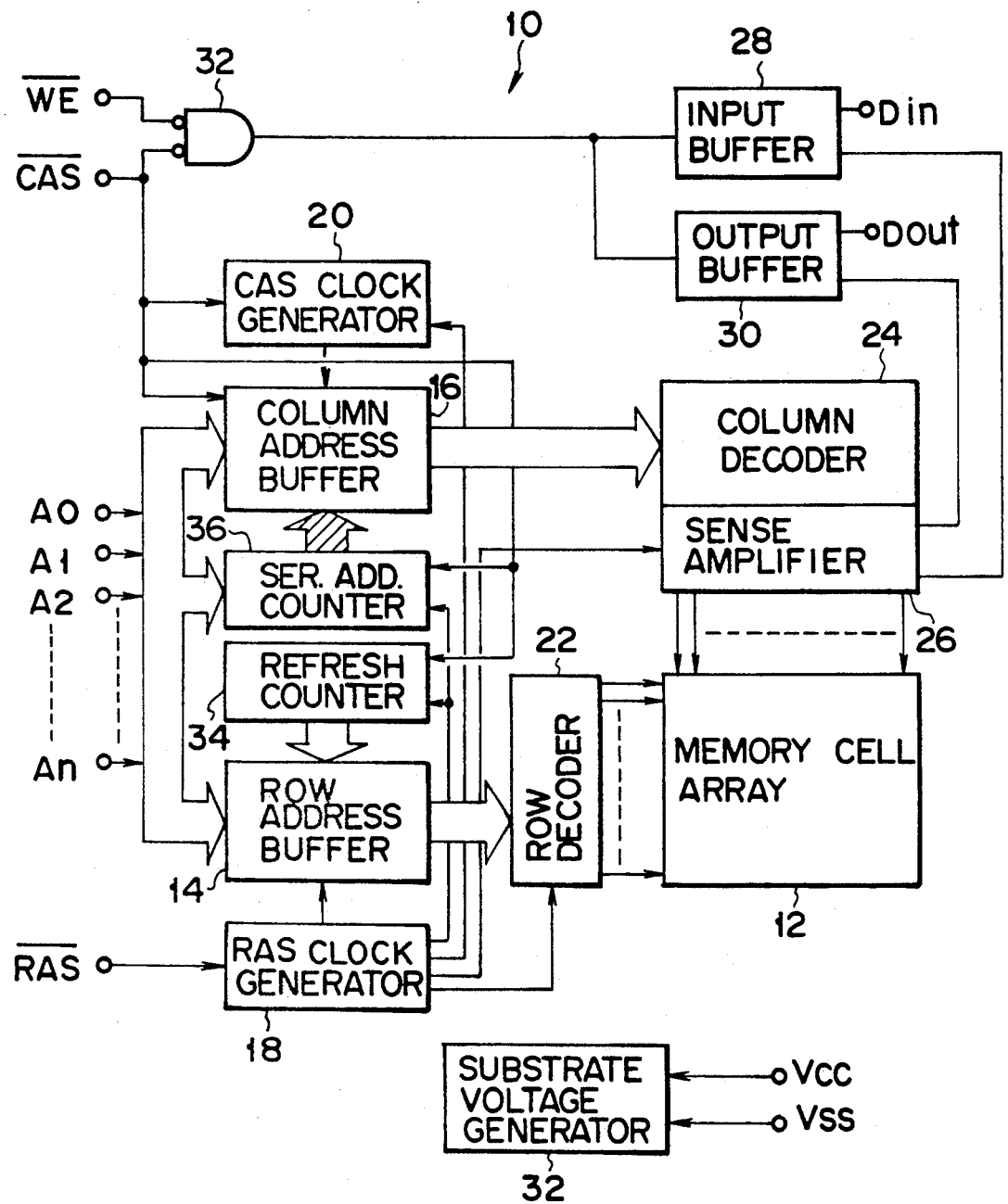
F I G. 1

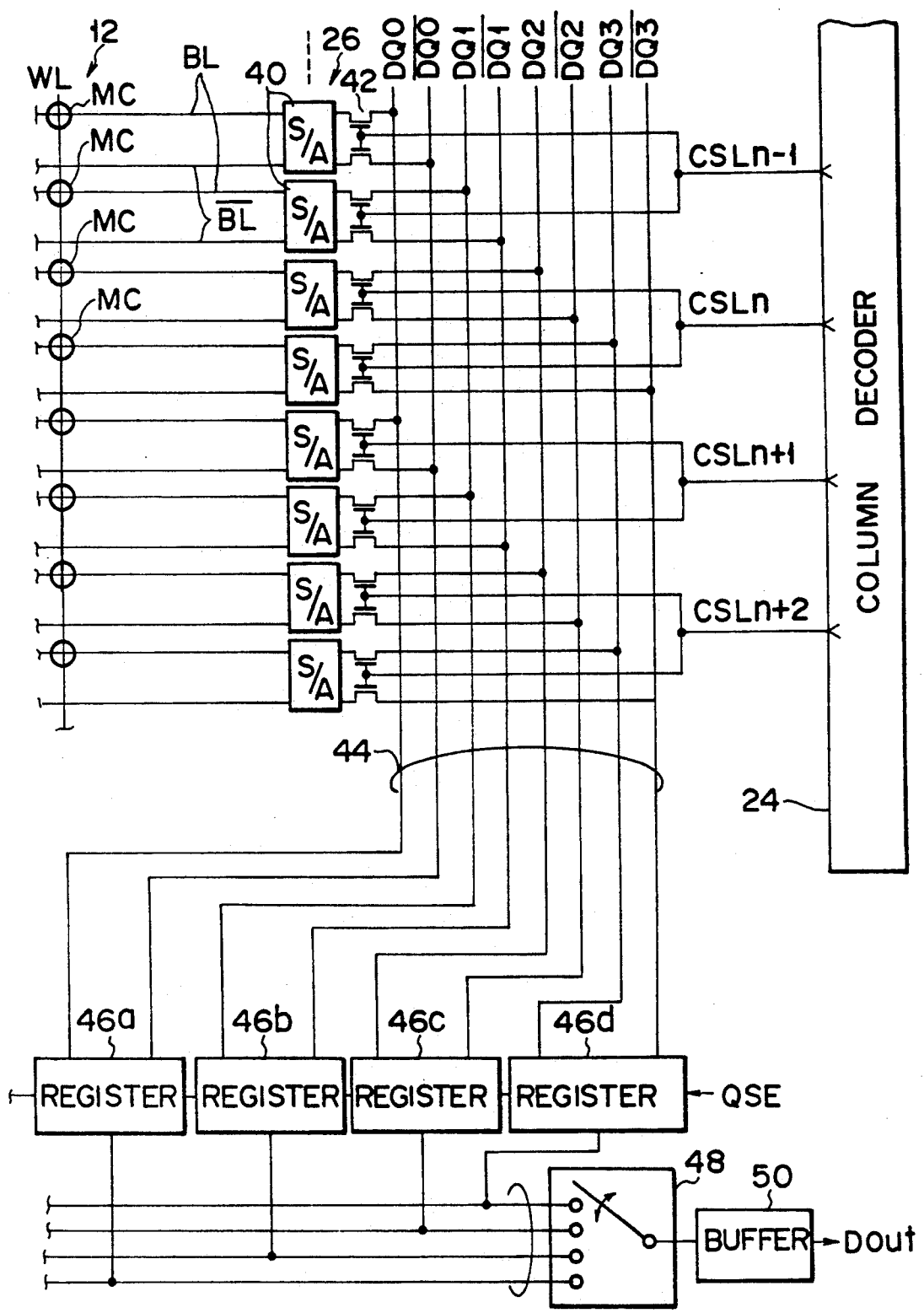
F I G. 2

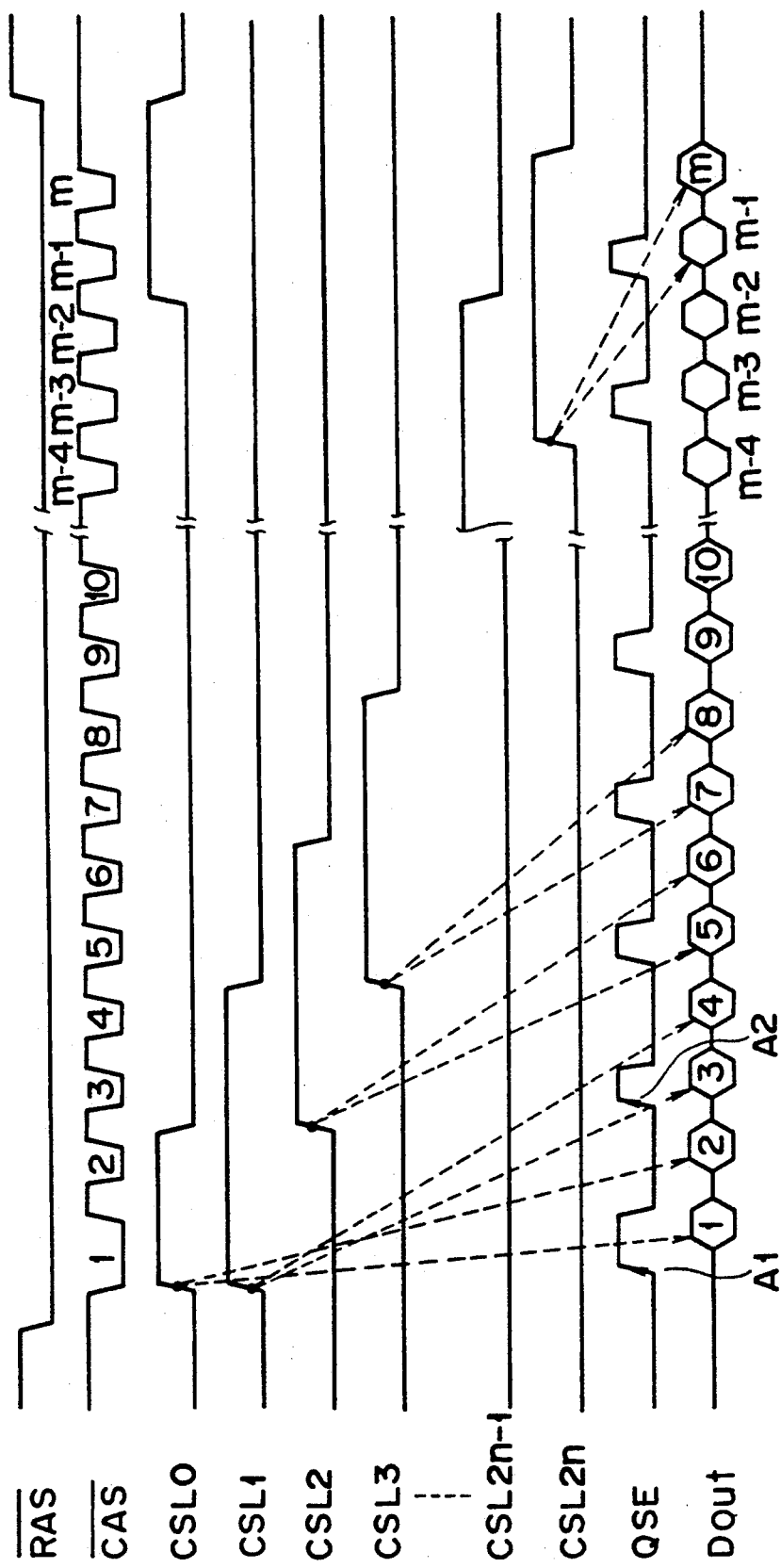
F I G. 4

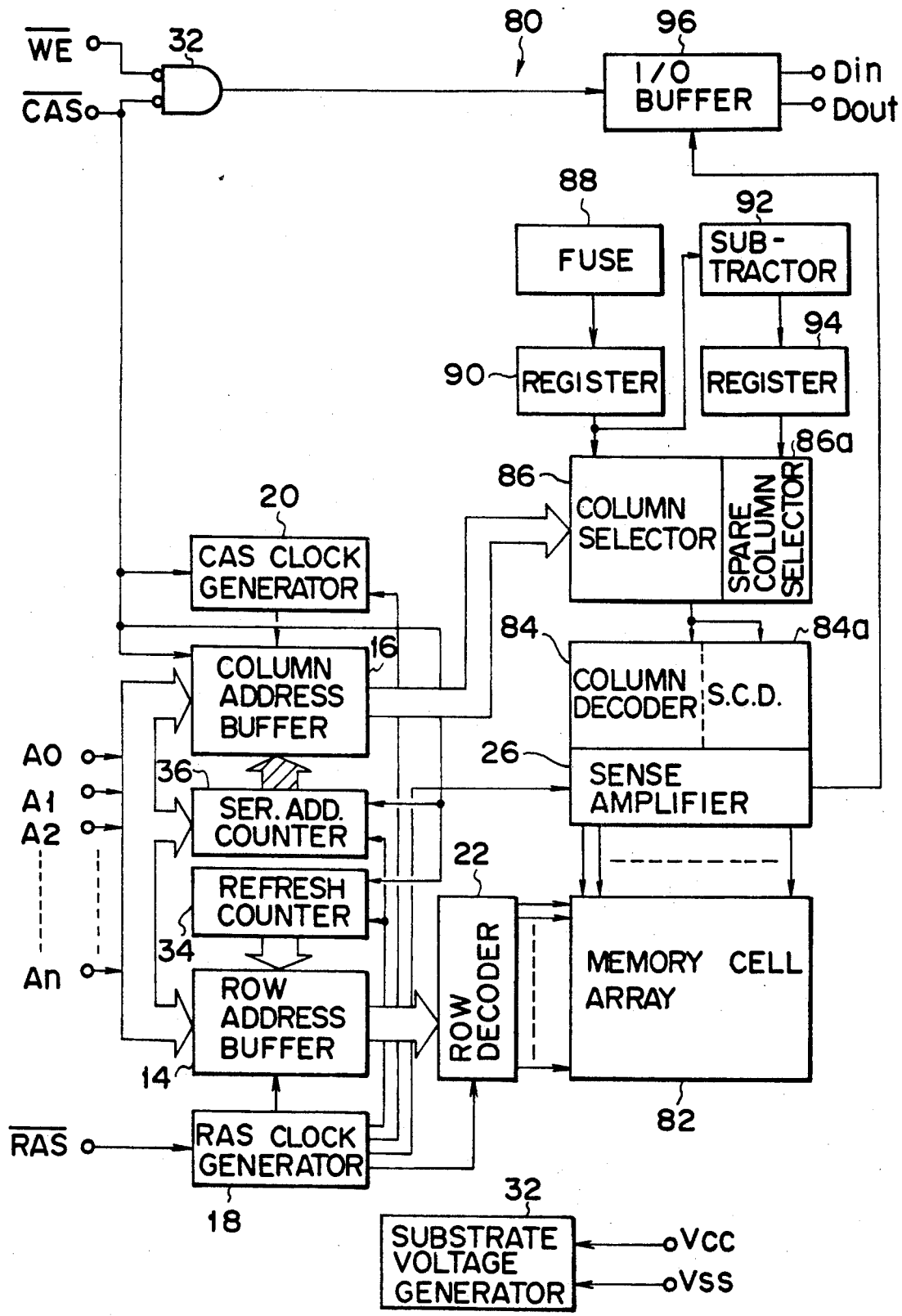
F I G. 7

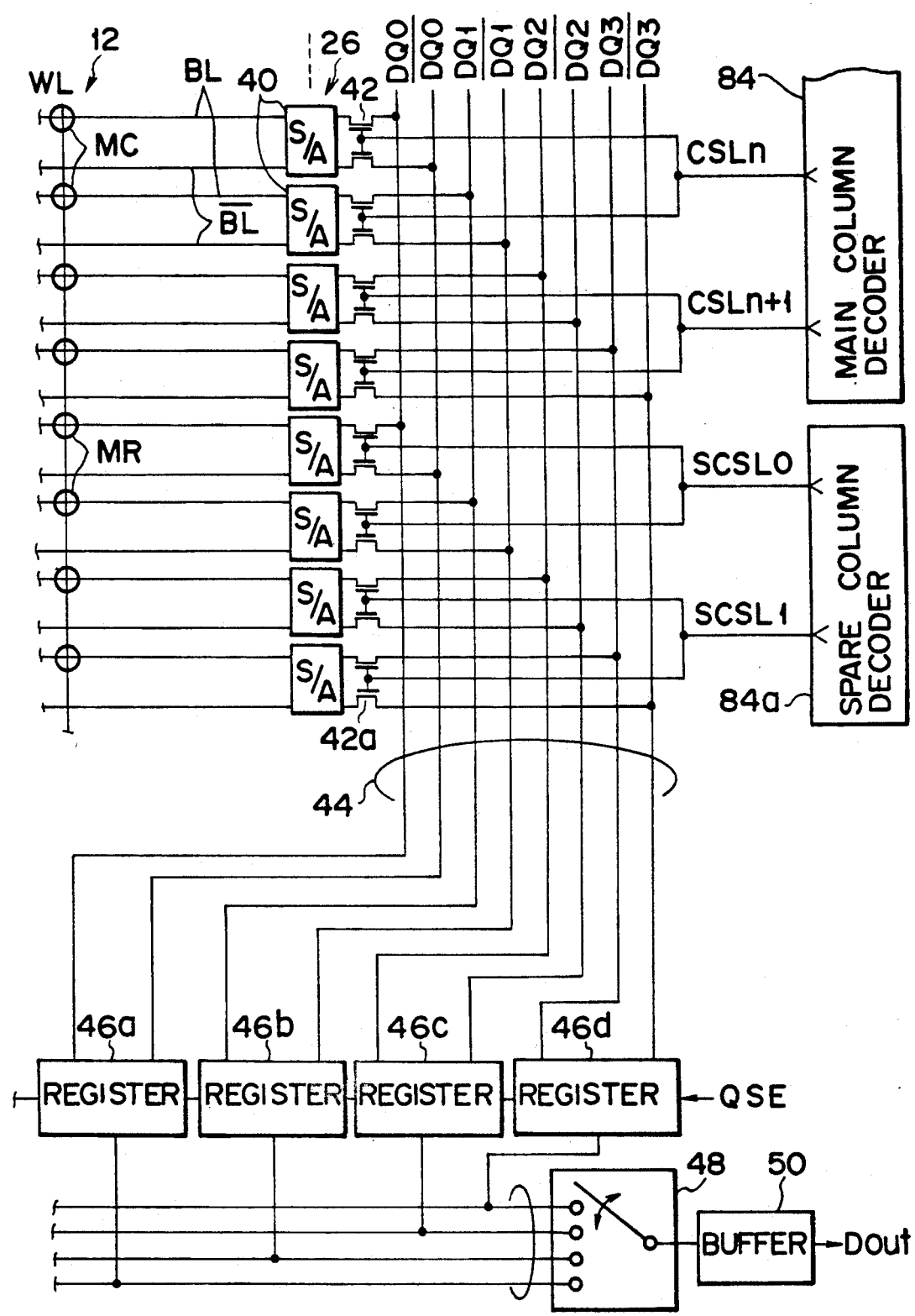
F I G. 8

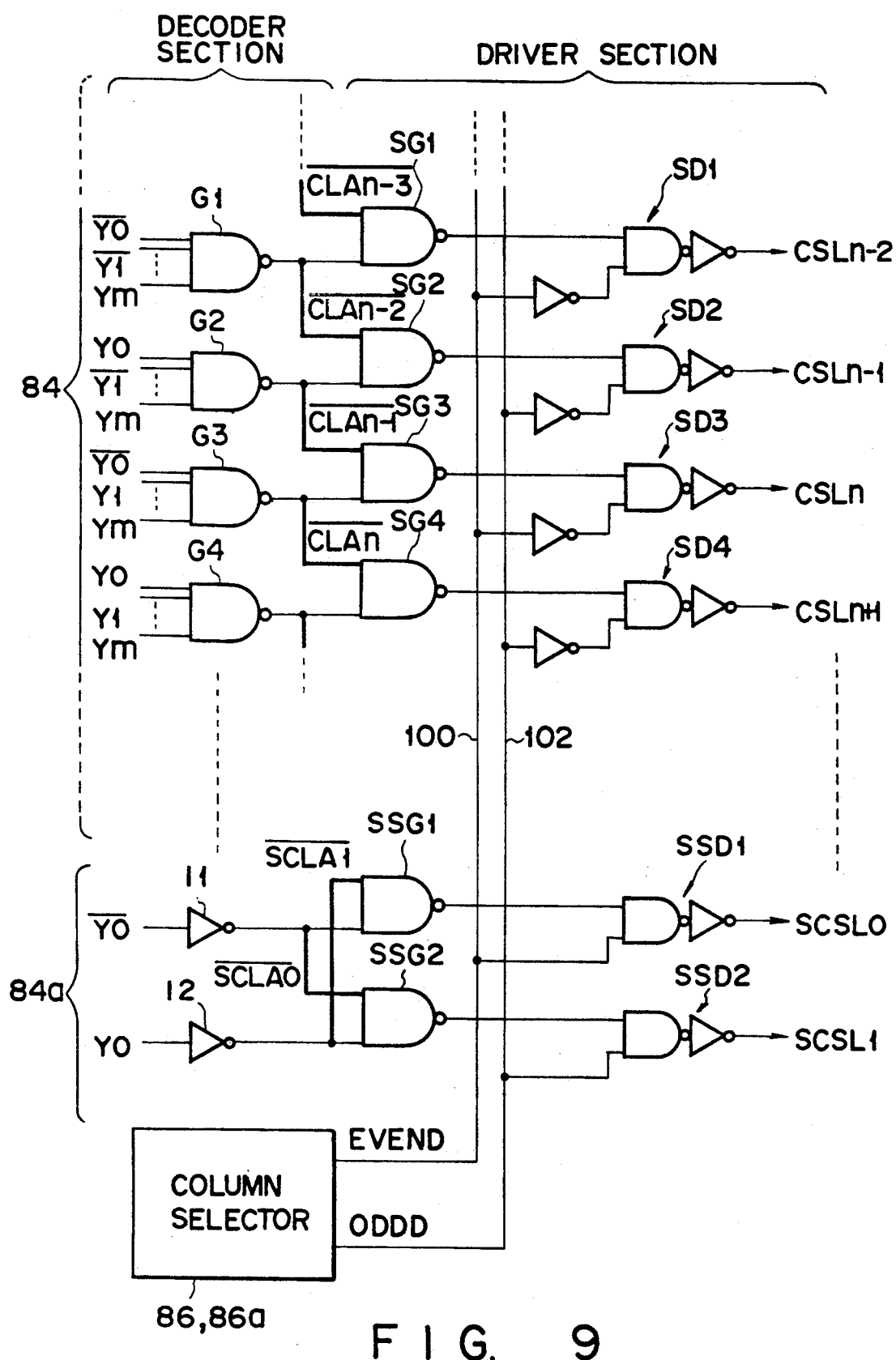
F I G. 9

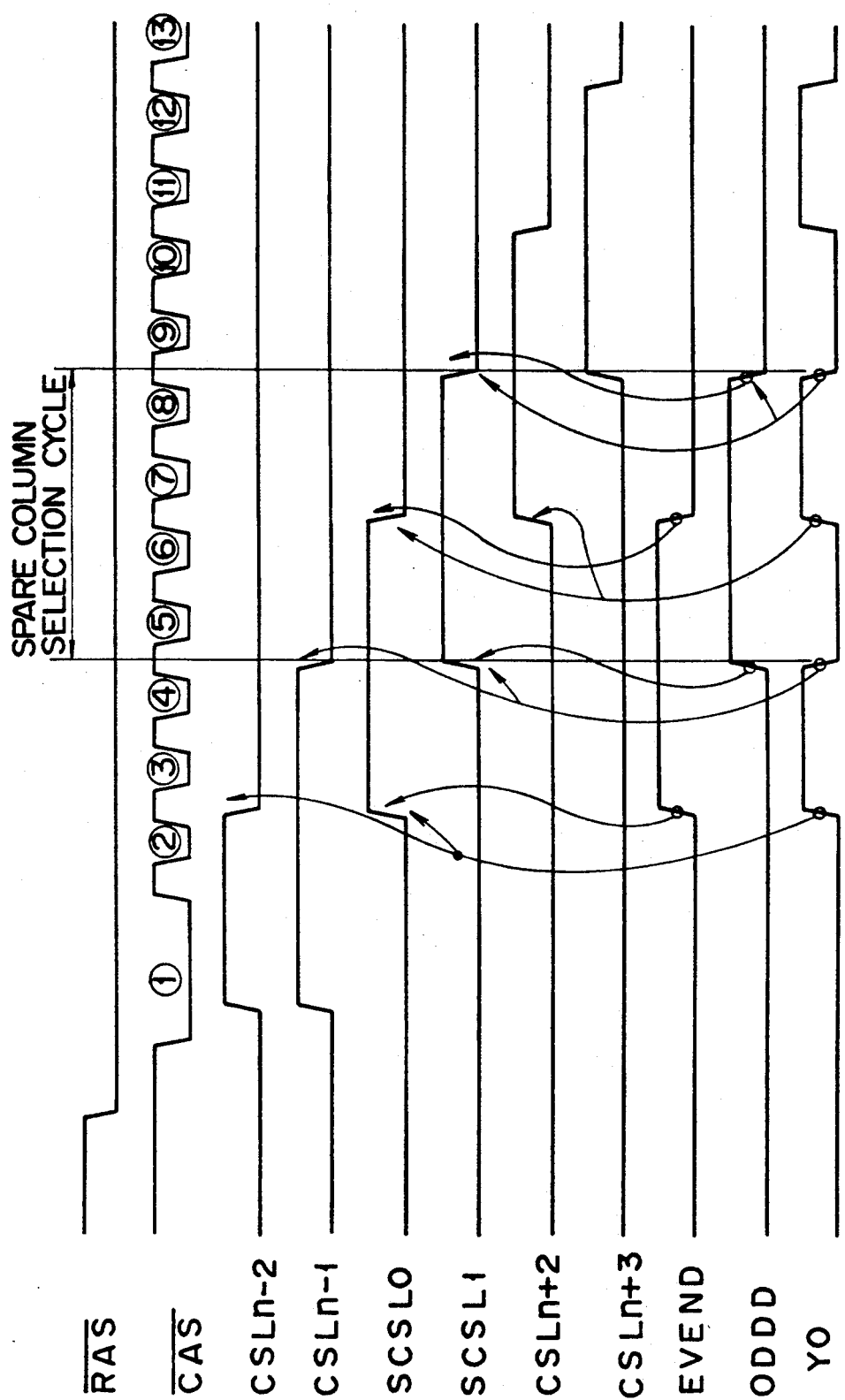
F I G. 10

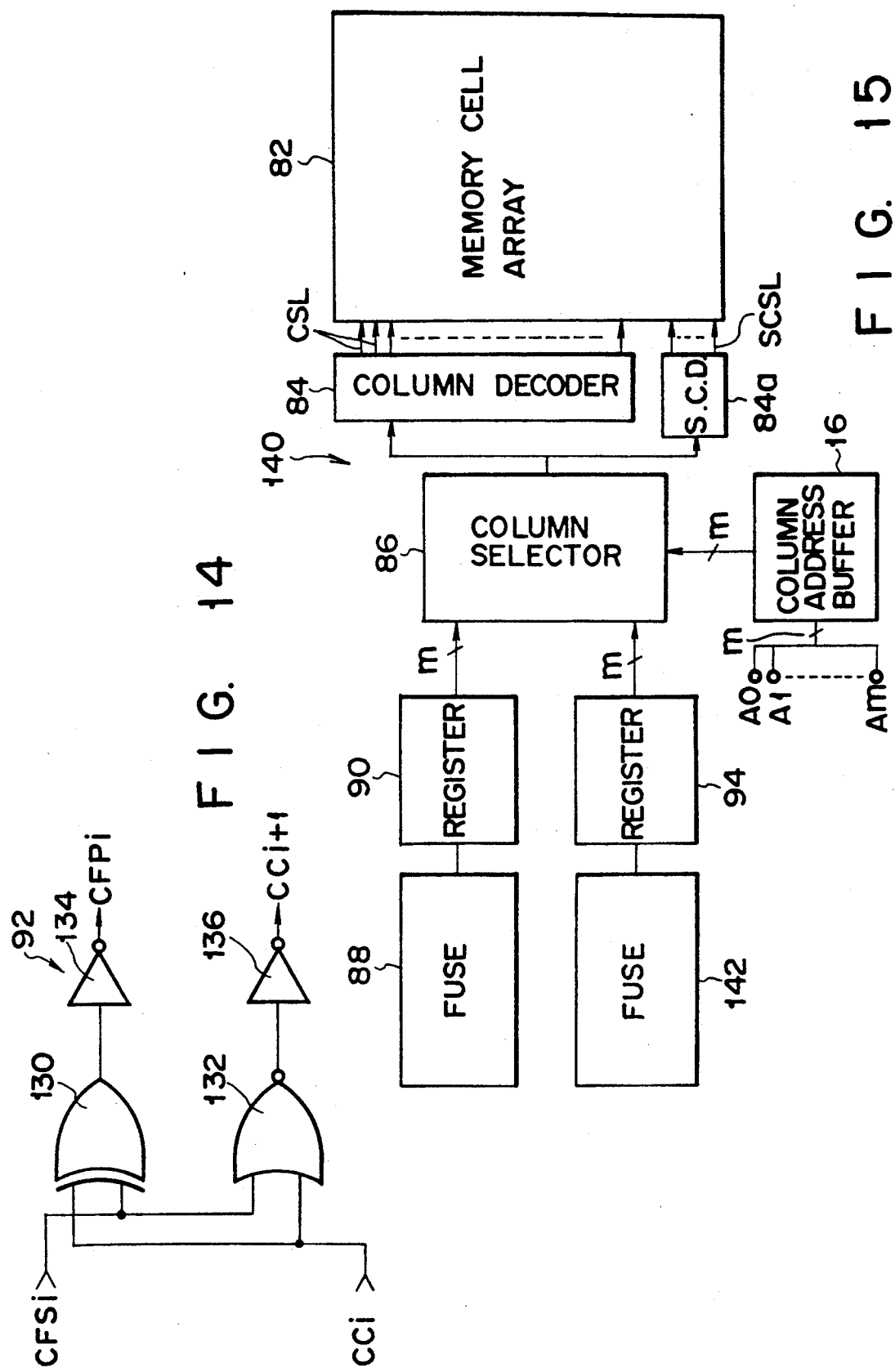

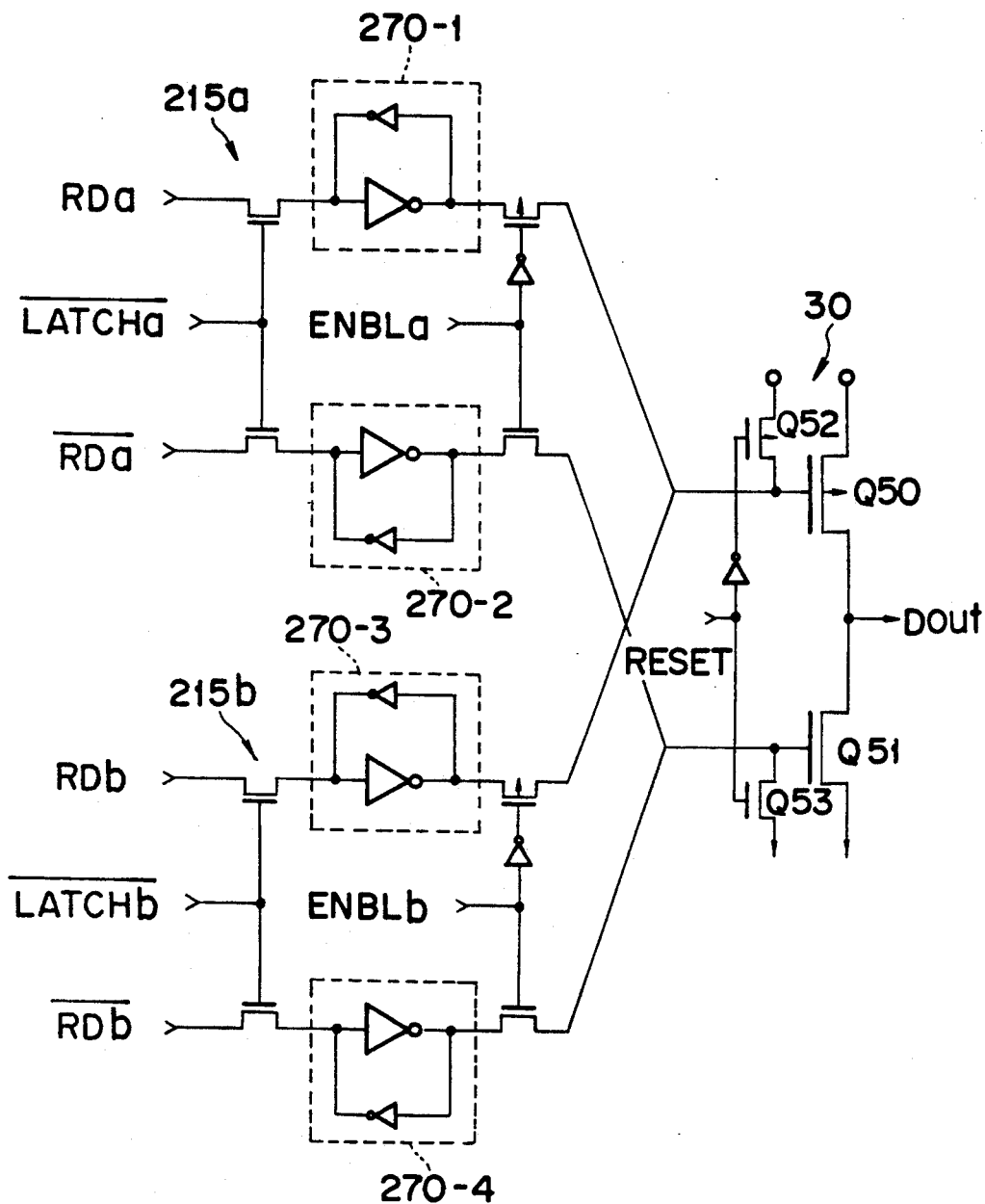
F I G. 20

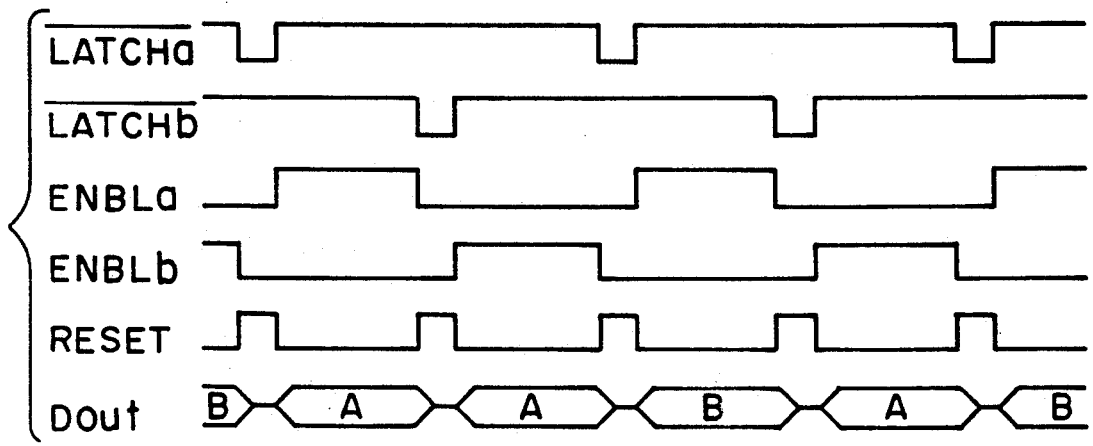
F I G. 21
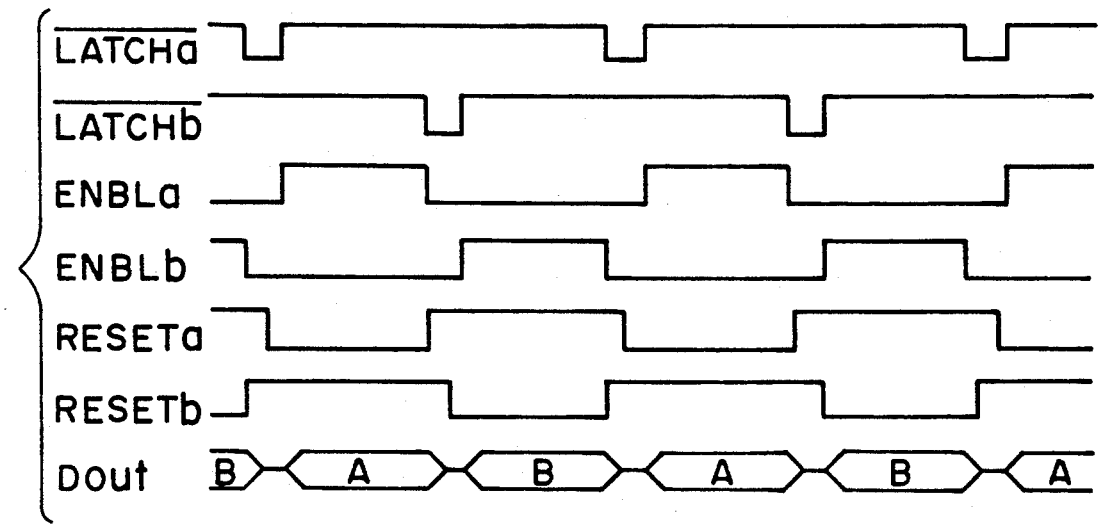
F I G. 23

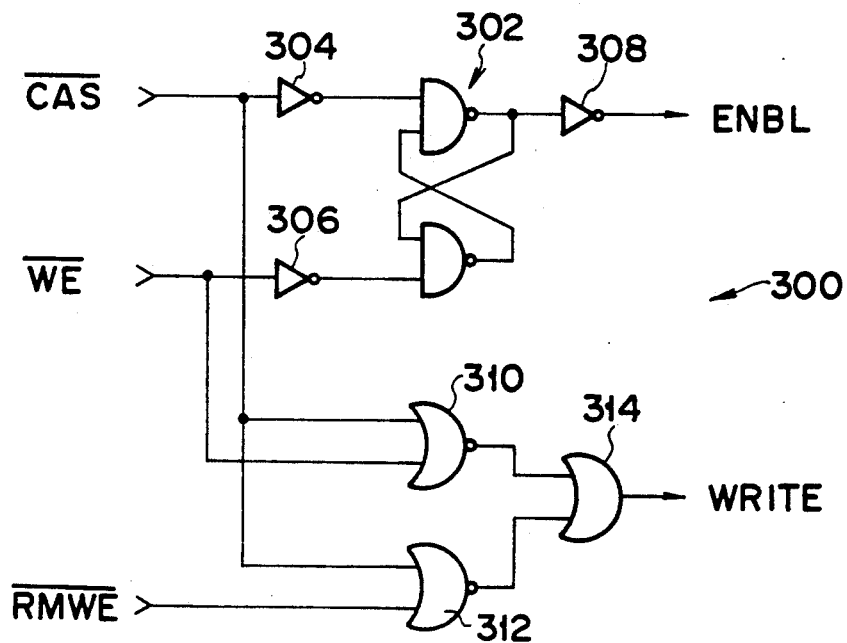
F I G. 26
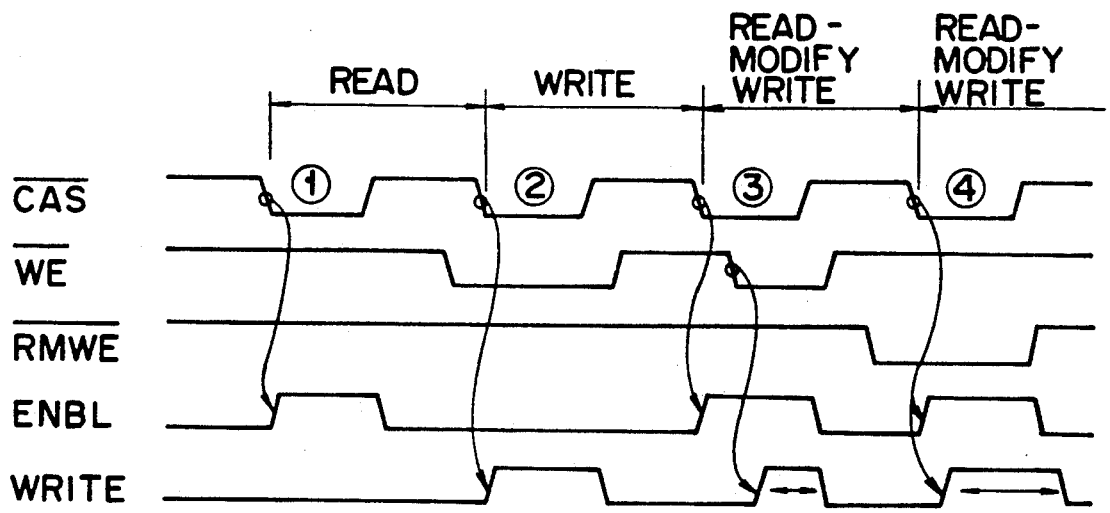
F I G. 27

DYNAMIC SEMICONDUCTOR MEMORY DEVICE WITH HIGH-SPEED SERIAL-ACCESSING COLUMN DECODER

BACKGROUND OF THE INVENTION

1. Field of the Invention

The present invention relates to a dynamic semiconductor memory device, and more particularly to a MOS random-access memory employing one-transistor memory cells arranged in rows and columns.

2. Description of the Related Art

MOS random access memory (RAM) devices have become more widely used in the manufacture of digital equipment as the speed of these devices increases while their cost decreases. The cost of a storage using MOS RAMs per bit has gone down as the number of bits per package or the number of memory cells has gone up. Recently, as the performance of digital equipment is improved, enhancement of the data accessing speed for such MOS RAM is demanded more severely.

To fulfill such a demand, presently-available dynamic RAMs (DRAMs) are provided with a high-speed access mode, such as page mode, nibble mode or static-column mode, in addition to the normal access mode. In the field of digital image-processing or computer systems designed to improve the data exchange with external storage units using a cache memory, it is also demanded strongly to realize a so-called "serial access" mode. The serial access mode is to serially access one selected row of memory cells and output the accessed results in a fixed order.

However, none of the above modes conventionally established are satisfactory. This is because these modes cannot sufficiently satisfy today's demand concerning high-speed data access in highly advanced digital equipment for the following reasons.

In the conventional page mode, those of memory cells of a DRAM which are associated with a selected row line can be accessed serially. Externally giving serial addresses can permit serial access to the selected row of memory cells. The improvement of the serial accessing speed is however still limited, which depends on the necessity to externally fetch individual column addresses every time in accordance with potential toggles of a column address-strobe signal ($\overline{CAS}$). This is an impediment hard to overcome for DRAMs that operate in page mode.

In a nibble mode, serial data access, such as read and write operations, is performed on a designated column in response to the toggles of $\overline{CAS}$. The nibble mode is similar to the page mode in that the access operation is controlled only by the toggles of $\overline{CAS}$. The nibble mode is however superior to the page mode in accessing speed. This arises because the nibble mode does not require to fetch the column address for each bit access operation after the second $\overline{CAS}$ cycle.

The nibble mode suffers from the limitation of the number of bits or memory cells which can be designed accessible at a time. The limitation of the accessible bit data number is originated from the following circumstances. In nibble mode multiple pieces of bit data are simultaneously transferred to a data latch register in the first toggling cycle of $\overline{CAS}$. In response to the subsequent toggles of $\overline{CAS}$, proper pieces of the latched pieces of bit data are selected at random and are sequentially transferred to an output port. Here, the number of registers provided in the data latch register determines the number of accessible bits. The number of the registers is not permitted to freely increase due to the limitation of the area on the chip substrate of the DRAM (the limitation of the layout margin); this number is set as high as about four bits. The limitation of the maximum accessible bit data number significantly clouds the aforementioned merit of the nibble mode.

It has been tried to apply the nibble mode to a serial accessing operation in order to provide high-speed serial access. In this case after multiple pieces of data stored in a column of memory cells are transferred to a data-latch register by activating one column address-select line, the sense operation gets started in the data-latch register. The number of selected cells is called "bit length," which corresponds to the maximum accessible data-bit number in nibble mode.

To achieve the serial access, a column address counter is typically mounted on the DRAM chip. The column address counter sequentially increases the internal address. It is necessary to activate a sense-activation signal QSE in the data latch register each time for specific $\overline{CAS}$ cycles ($4n+1$ $\overline{CAS}$ cycles when the accessible bit number is "4" where $n=1, 2, \ldots$). That is, the access time is delayed before $4n+1$ $\overline{CAS}$ cycles come. The delayed sense time is twice as long as or longer than the ordinary sense time. The delay of sense time inevitably occurs in a specific time interval; this is a bottleneck in improving the total access speed of DRAMs.

SUMMARY OF THE INVENTION

It is therefore an object of the present invention to provide a new and improved technique for high-speed serial-accessing operation in MOS memory devices.

It is another object of the present invention to provide a new and improved MOS dynamic memory device which is excellent in the integration density and serial accessing speed thereof.

In accordance with the above objects, the present invention is drawn to a specific MOS memory device that includes an array of memory cells arranged in rows and columns. A row decoder is connected to rows of memory cells, for selecting one of the rows of memory cells in response to a row address signal externally supplied thereto. A column decoder is connected to columns of memory cells, for designating a certain column in response to an input column address signal externally supplied thereto. When activating the certain column, the column decoder activates a column adjacent to the certain column before the corresponding column address actually arrives.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a schematic block diagram illustrating an internal circuit arrangement of a MOS serial access memory embodying the present invention.

FIG. 2 is a diagram illustrating the essential circuit arrangement of the primary section in the memory in FIG. 1.

FIG. 4 is a timing diagram showing pulse sequences for the operation of the embodiment in FIGS. 1-3.

FIG. 7 is a schematic block diagram illustrating an internal circuit arrangement of a MOS serial access memory embodying the present invention.

FIG. 8 is a diagram illustrating the essential circuit arrangement of the primary section in the memory in FIG. 7.

FIG. 9 is a diagram illustrating the internal circuit arrangements of a column decoder and a spare column decoder in FIG. 8.

FIG. 10 is a timing diagram showing pulse sequences for the accessing operation of redundancy column-selection in the embodiment in FIGS. 7-9.

FIG. 14 is a diagram showing the internal arrangement of a subtractor shown in FIG. 7.

FIG. 15 is a schematic block diagram illustrating the circuit arrangement of the essential part of a MOS serial-access memory according to another embodiment of the present invention.

FIGS. 20 and 22 are embodiments of a data output section in the DRAM of FIG. 16, and FIGS. 21 and 23 are illustrations of timing diagrams showing pulse sequences of the embodiments of the preceding figures.

FIG. 26 is a diagram showing the circuit configuration of an output-enable/write signal generator that is employed in a DRAM with an exclusive control pin for a "read-modify write" operation of the present invention.

FIG. 27 is an illustration of a timing diagram showing pulse sequences of the circuit of FIG. 26.

DETAILED DESCRIPTION OF THE PREFERRED EMBODIMENTS

Figure 3:
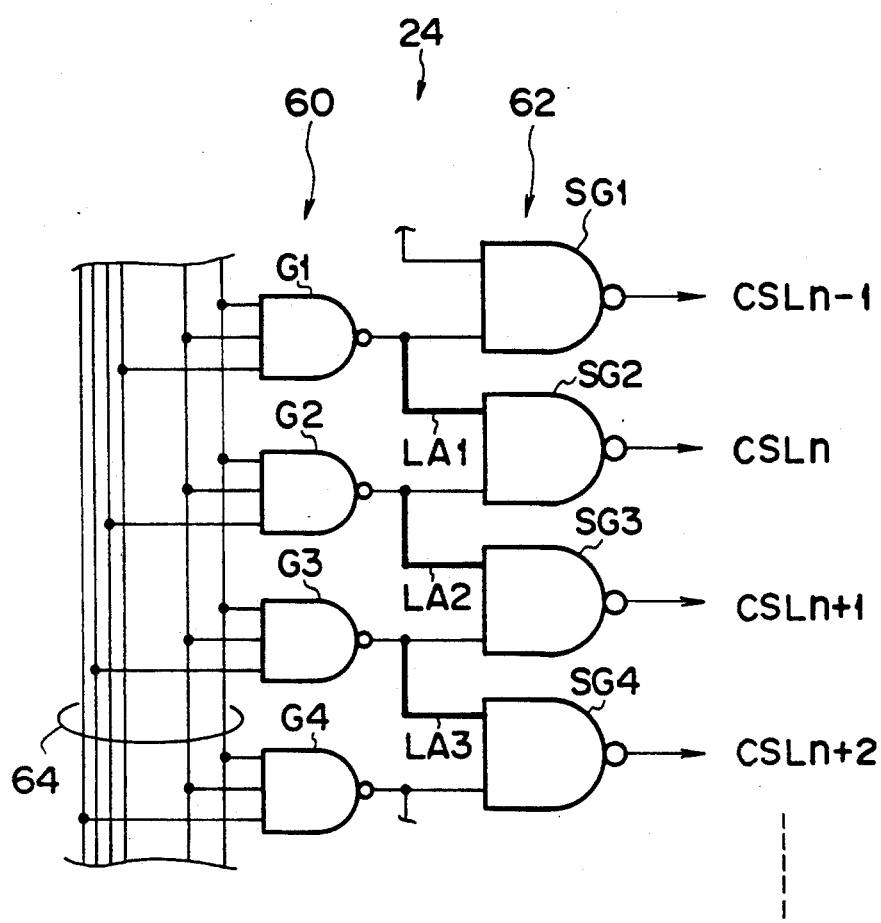
FIG. 3 is a diagram illustrating the internal circuit arrangement of a column decoder in FIG. 2.

Referring now to FIG. 1, a MOS serial-access memory device according to one preferred embodiment of the invention is generally designated by reference numeral 10. The memory device 10 has a memory cell array section 12 on its chip substrate. Section 12 includes an array of dynamic memory cells that are arranged in rows and columns. These memory cells are associated with parallel data transfer lines, and parallel control lines which insulatively cross the data transfer lines. One memory cell is arranged at each cross point of the crossed lines. The data transfer lines are called "bit lines," while the control lines are called "word lines." Every memory cell includes a storage capacitor and a data transfer switching device. The switching device may be a metal-oxide-semiconductor field effect transistor (MOSFET), which is called a "memory cell transistor."

A row address buffer 14 and a column address buffer 16 are connected to address bit inputs A0, A1, A2, ... An. A clock generator 18 is connected to a row address strobe input terminal $\overline{RAS}$ to generate a clock signal for driving the row address buffer 14. A clock generator 20 is connected to a column address strobe input terminal $\overline{CAS}$ to generate a clock signal for driving the column address buffer 16. The output of the row address buffer 14 is connected via a row decoder 22 to the memory cell array 12. The output of the column address buffer 16 is connected via a column decoder 23 to the memory cell array 12. Decoders 22, 24 decode address bits Ai (i=0, 1, 2, ... n) which are fetched in buffers 14, 16. A sense amplifier circuit 26 includes a sense amplifier unit and an input/output gate unit, both well known, for executing sense operation of data stored in memory cell array 12.

An input buffer 28 and an output buffer 30 are connected to the sense amplifier circuit 26. Buffers 28 and 30 have their inputs connected to the output of an AND gate circuit 32. The AND gate circuit 32 has a write enable signal input $\overline{WE}$ and a column address-strobe input $\overline{CAS}$. Input buffer 28 may be a latch circuit that temporarily stores data supplied thereto. Output buffer 30 is a latch circuit that temporarily holds output data. A substrate voltage generator 32 applies a regulated constant DC voltage to the chip substrate. A refresh counter circuit 34 is responsive to $\overline{RAS}$ and performs a self-refresh operation on the rows and columns of memory cells in the memory cell array 12.

The embodiment device 10 features in that it incorporates therein a serial address counter circuit 36. The serial address counter 36 generates serial addresses along columns in the memory cell array 12. Counter 36 is arranged to simply count up or increase its count value in synchronism with the potential toggles of $\overline{CAS}$. The output of counter 36 is supplied to the column address buffer 16. Alternatively, counter 36 may supply its output directly to the column decoder 24, without through buffer 16.

In FIG. 2 a detailed circuit configuration of the memory cell array 12, the column decoder 24 and the sense amplifier circuit 26 is shown, wherein only memory cells MC along a word line WL are shown in the cell array 12 for purpose of illustration. A preselected number of bit lines BL, $\overline{BL}$ cross the word line WL. The memory cells are arranged at the individual intersections. A sense amplifier circuit 40 is provided for each pair of bit lines BLi, $\overline{BLi}$. Each sense amplifier 40 is connected through transfer gates 42 to a corresponding pair DQi, $\overline{DQi}$ of input/output (I/O) data line pairs 44. Each transfer gate 42 includes a couple of switching MOS transistors, the gate electrodes of which are connected in common.

More specifically, the sense amplifier circuit 40 is subdivided into several blocks. Each block includes four sense amplifiers. The number of I/O data line pairs 44 is equal to that of these sense amplifiers; i.e., there are four pairs of I/O data lines segments DQ0, $\overline{DQ0}$; DQ1, $\overline{DQ1}$; DQ2, $\overline{DQ2}$; and DQ3, $\overline{DQ3}$. Column decoder 24 generates column select signals CSLn−1, CSLn, CSLn+1, CSLn+2, .... Each of these signals is supplied to two transfer gates 42 that are associated with two neighboring sense amplifiers 40. In response to this, two adjacent transfer gates 42 at a selected column address and the following column address turn on simultaneously. Binary information stored in two adjacent memory cells on the word line WLi is simultaneously developed on the corresponding two pairs of I/O data line segments DQ, $\overline{DQ}$. This allows two bit line pairs BL, $\overline{BL}$ — i.e., a pair having a memory cell at the target column address and the other pair having a memory cell at the following column address — to be connected together to the corresponding I/O data lines.

The four pairs of I/O data lines 44 are respectively connected to four data-latch registers 46a, 46b, 46c, 46d that are connected in series. Each data-latch register 46 temporarily holds or latches a sensed data voltage on a corresponding pair of the I/O data lines. The outputs of the registers 46 are respectively connected to the inputs of a multiplexer 48. Multiplexer 48 sequentially selects and outputs the latch inputs in a fixed order. The output of multiplexer 48 is sent via a data buffer 50 to an external output Dout.

The column decoder 24 may be arranged as shown in FIG. 3. Two-input NAND gates SG1, SG2, SG3, SG4, ... are additionally provided in the output stage of an address decoding section 60, which includes multi-input NAND gates G1, G2, G3, G4, ... that are conventionally used. Two-input NAND gates SG constitute a column-select driver section 62. Address-decode gates G have inputs connected to column address lines 64. The outputs of gates SG are connected to column-address select outputs CSL. Each gate SG has a first input connected to the output of a corresponding address-decode gate G, and a second input connected to the output of another address-decode gate G located adjacent thereto, which corresponds to the previous column address. For example, the first input of select driver gate SG2 is connected to the output of address-decode gate G2, and the second input thereof is connected by a signal line LA1 to the output of gate G1 whose column address precedes by one that of gate G2. Signal line LA for each gate SG will be referred to as "look-ahead signal line." In FIG. 3, look-ahead signal lines LA are illustrated by thick lines, simply for visual emphasis only.

The operation of this embodiment is as follows. To begin with, the operation of column decoder 24 will be explained. In address decoder section 60, one proper output of NAND gate G potentially drops to a low level ("L" level) in accordance with a column address supplied thereto, causing one column-select line CSL to be selected. Assume that the output of gate G1 changes to "L" level. The "L" level output is supplied to the first input of driver gate SG1; it is also supplied to the second input of the adjacent driver gate SG2 via look-ahead line LA. The outputs of two neighboring driver gates SG1, SG2 potentially rise toward a high level ("H" level). Therefore, specific two column-select lines are selected and activated: a column-select line CSLn−1 corresponding to the input column address, and the next column-select line CSLn corresponding to a column address which immediately comes after the previous address.

When a next column address is sent to section 60, the output of gate G1 rises from a "L" level back to the "H" level, and the output of gate G2 falls to the "L" level. The output of gate SG1 returns to the "L" level causing column-select line CSLn−1 to be deactivated. Driver gate SG2, corresponding to the received column address, has the "L" level at the first input thereof, and has the "H" level at its second input, thus maintaining the "H" level output. An "L" level voltage is applied to the second input of the third gate SG3 via look-ahead signal line LA2. The output of gate SG3 is at the "H" level activating column-select line CSLn+1 toward the "H" level. Similar gate operations will be made repeatedly for the remaining gates SG4 and so forth in such a manner that, upon reception of every column address, always two adjacent column-select lines CSL simultaneously become at the "H" level, whereby the two lines are potentially activated in advance to the arrivals of their corresponding column addresses.

The DRAM 10 executes its read operation in a serial-accessing mode to be explained below. As shown in FIG. 4, when row address strobe signal $\overline{RAS}$ drops to the "L" level, DRAM 10 enters in an active cycle, and a row address is fetched. In the first cycle of toggles of $\overline{CAS}$, column-select line CSL0 that is determined by the input column address is selected and activated. Simultaneously, column-select line CSL1 adjacent to CSL0, which corresponds to the next (succeeding) column address, is selected and activated. The storage data bits are read from four memory cells among those arranged along a word line WLi. This may be understood easily if the two selected column-select lines are regarded as lines CSLn−1, CSLn in FIG. 2.

The four storage data bits are sensed by corresponding ones of sense amplifiers 40, and are each developed on four pairs of the I/O lines 44 (DQ0, $\overline{DQ0}$; DQ1, $\overline{DQ1}$; DQ2, $\overline{DQ2}$; DQ3, $\overline{DQ3}$) through four transfer gates 42 which have been turned on. The read data bits are transferred to data-latch registers 46a, 46b, 46c, 46d, and then latched therein at a timing A1 (see FIG. 4) where a sense activation signal QSE rises to the "H" level. The latched four data bits are sequentially read out from the output terminal Dout in synchronism with the toggles of $\overline{CAS}$ under the control of multiplexer 48.

As the second cycle of $\overline{CAS}$ ends, the serial address counter 36 of FIG. 1 increases the input column address by one. This is an increment of a column address. At this time, the internal column address of DRAM 10 is in the condition for selecting column-select line CSL1. This column-select line CSL1, however, has already been selected by the "look-ahead" function of column decoder 24, as previously described. Therefore, the time required to activate this column-select line is substantially zero.

The initially activated column-select line CSL0 is deactivated when column-select line CSL2 is selected. Two new storage data bits are thus introduced into I/O lines 44, and transferred to two corresponding registers 46a, 46b. The data bits are latched there at a timing A2 (see FIG. 4) where signal QSE rises again to the "H" level. Similarly, the remaining column-select lines CSL are newly selected every two cycles of $\overline{CAS}$ in accordance with every increment of the internal column address in DRAM 10. Therefore, with two column-select lines CSL having selected, high-speed serial data reading can be performed.

With such an arrangement, it is possible to substantially completely eliminate a delay in access time, which may occur when conventionally selecting the internal column address, as described in the introductory part of the specification. This improves the serial access speed. Theoretically, the "access-speed improving" technique may also be applied to read/write cycle, it will provide the semiconductor manufactures with significant merits.

Figure 5:
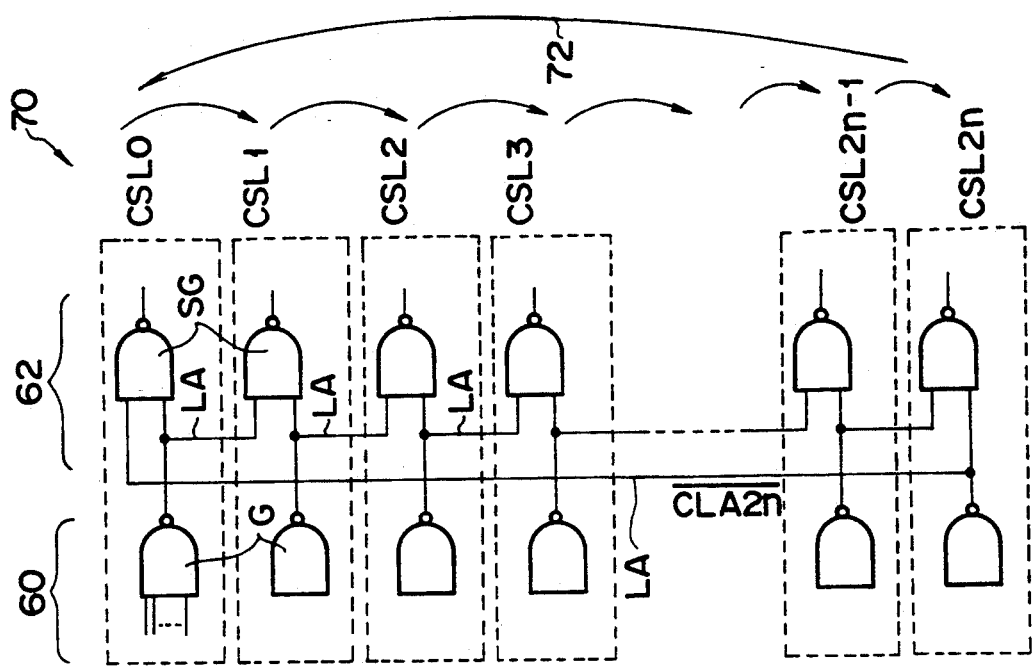

In a case wherein the invention is applied as a specific memory exclusive for digital image processing, the column decoder arrangement of FIG. 3 may be modified as shown in FIG. 5. A column decoder 70 of FIG. 5 features in that it is added with a "pointer function," which is well-known in the field of image-processing. The pointer function can be regarded as a "position-searching" function, which enables to designate a desired address bit in response to a column address, and to cause a serial access to get started at the address bit designated. Such function is important for an image memory to speed up the horizontal dot-scrolling on a display screen.

The column decoder 70 shown in FIG. 5 differs from the decoder 24 of FIG. 3 in the following point: an output line CLA2n of address decoder section 60 for the last column-select line CSL2n serves also as a look-ahead signal line LA for the first column-select line CSL0. With such a look-ahead line arrangement, selecting column-select line CSL2n automatically leads to selecting line CSL0. The pointer function can thus be attained without waste of extra circuits.

Figure 6:
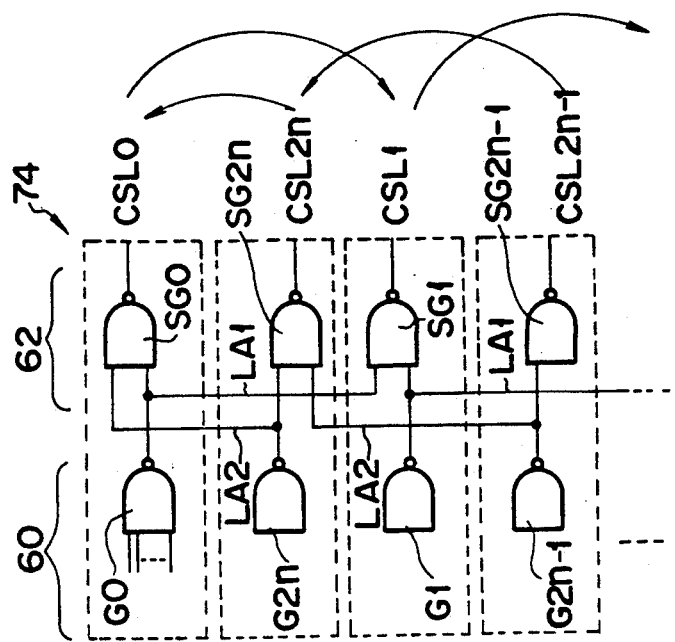
FIGS. 5 and 6 are diagrams illustrating modifications of the column decoder shown in FIG. 3.

In FIG. 6 another column-decoder arrangement 74 having the pointer function is shown, wherein the decoder 74 is featured by its function to alter the physical access order of column-select lines CSL. First lines LA1 and second lines LA2 are provided as the look-ahead signal lines LA. First look-ahead signal line LA1 are downward lines for address designation; second look-ahead signal lines LA2 are upward address-designation lines. Each line LA1 connects together the inputs of those of two-input NAND gates SG which are positioned alternately in the column-select driver section 62, such as gates SG0, SG1 between which gate SG2n is located. Each line LA2 connects together the inputs of the two of the remaining gates, such as SG2n, SG2n−1 between which gate SG1 is positioned. In other words, column-select line CSL2n is arranged between the first and second column-select lines CSL0, CSL1; the line CSL1 is laid between line CSL2n and the previous column-select line CSL2n−1. The same "alternate" line arrangement is repeated in the column decoder.

The alternate arrangement of column-select lines CSL may be also represented as follows: column-select lines CSL0, CSL1, . . . , which correspond to 1-bit increments from the physically lowest address, and column-select lines CSL2n−1, CSL2n, . . . , which correspond to 1-bit decrements from the physical highest address, are alternately and linearly arranged. With this structure, look-ahead lines LA1, LA2 are equal in length to each other and short. A distinctively long line such as the line LA of FIG. 5 does not appear. Therefore, the delay in look-ahead operation can be minimized, preventing the operational margin from reducing in the DRAM.

Turning now to FIG. 7, a MOS dynamic serial-access memory device 80 in accordance with the second embodiment of the invention is shown, wherein the device 80 includes a memory cell array 82. The array 82 includes, in addition to the column-select lines CSL, specific column-select lines that are associated with redundancy columns for saving a damaged column. These additional column-select lines are called "spare column-select lines." With the embodiment, when there exists a damaged column in array 82, an address preceding the address of the damaged column by one is generated inside the chip, thereby enabling of continuous high-speed serial access operation even in a memory system provided with the redundancy columns. A subtractor means may be employed to generate such an address. By executing the afore-mentioned look-ahead operation with respect to the spare column-select lines in a spare column decoder using the output address data of the subtractor, a spare column-select line corresponding to the damaged column can be potentially activated before the damaged column is actually selected. This can eliminate time waste when the column address changes.

The arrangement of FIG. 7 is similar to that shown in FIG. 1 with the memory cell array 12 being replaced with the memory cell array 82 that includes redundancy columns. To drive these redundancy columns a spare column decoder 84a is arranged in addition to a main column decoder 84. The column address buffer 16 is connected to spare decoder 84a through a column selector circuit 86, which includes a spare column selector 86a for selecting a suitable redundancy column in the memory cell array 82. A redundancy column fuse 88 is connected to column selector 86 via a fuse-data register 90, which holds the fuse data output indicative of the address of any damaged column. The output of register 90 is also connected to a subtractor circuit 92, which is connected at its output to spare column selector 86a via a fuse-data register 94. Spare column selector 86a is responsive to the register output as well as column address buffer 16. An input/output buffer 96 is associated with gate 32 and sense amplifier section 26; the function of it is similar to those of the buffers 28, 30 shown in FIG. 1.

The output data of register 90 that indicates the damaged column address is supplied to subtractor 92. Subtractor 92 then performs subtraction on the received data to supply register 94 with the resultant data indicating an address preceding the address by one. Register 94 holds the data. Register 94 sends its output to spare column selector 86a, so that the look-ahead operation can be performed on not only the main column-select lines CSL but also the spare-column-select line(s). When the address in fuse-data register 94 matches with the output of serial counter 36 indicating the chip internal address, a corresponding spare-column-select line is activated, whereby the look-ahead operation can be executed essentially in the same manner as described above.

The spare column decoder 84a and a circuit arrangement associated therewith ar shown in detail in FIG. 8. The outputs of spare column decoder 84a are connected via respective spare column-select lines SCSL0, SCSL1 to a plurality of pairs of bit-lines constituting corresponding spar columns. The circuit configuration is same as that of FIG. 2 using the column-select lines CSL. When one of spare column-select lines SCSL is selected, two adjacent transfer gates 42a turn on causing the two spare columns associated therewith to be connected to the corresponding pairs of the I/O lines 44 (DQ0, $\overline{DQ0}$; DQ1, $\overline{DQ1}$; DQ2, $\overline{DQ2}$; DQ3, $\overline{DQ3}$). In FIG. 8 "MR" designates redundant memory cells in the redundancy columns.

The internal circuit configurations of the main and spare column decoders 84, 84a are illustrated in FIG. 9. Main column decoder 84 is similar to the column decoder 24 of FIG. 3 in that it has an array of multi-input NAND gates G and an array of two-input NAND gates SG. Thick lines represent a look ahead lines $\overline{CLAn-3}$, $\overline{\text{CLAn-2}}$, . . . . Decoder 84 includes in its driver section select driver units SD1, SD2, SD3, SD4, . . . , which are connected respectively to the outputs of NAND gates SG. These units are connected via signal lines 100, 102 to column selector 86. Each unit SDi includes an inverter, a two-input NAND gate and another inverter as shown. The output of each unit SDi is connected to a corresponding column-select line CSL. Column selector 86 sends an output signal EVEND to line 100, and spare column-selector 86a sends an output signal ODDD to line 102. Units SD are alternately connected to lines 100, 102 such that one of the inputs of the first state inverter in every unit SD is connected alternately to lines 100 or 102.

The spare column decoder 84a includes an array of inverters I1, I2, in its decoder section. Inverters I1 and I2 are respectively connected to the first inputs of two-input NAND gates SSG1, SSG2. The first and second inputs of NAND gates SSG1, SSG2 are cross-coupled as shown in FIG. 9. Thick lines represent look-ahead lines $\overline{\text{SCLA0}}$ and $\overline{\text{SCLA1}}$. The outputs of NAND gates SSG1, SSG2 are connected respectively to spare select driver units SSD1, SSD2. Each unit SSD has a series circuit of a two-input NAND gate and an inverter. The output of each unit SSD is connected to a corresponding spare column-select line SCSL0 (or SCSL1). Unit SSD1 is connected to EVEND line 100 at one input of its NAND gate. Unit SSD2 is connected to ODDD line 102 at one input of its NAND gate.

The main and spare column decoders 84, 84a operate responding not only to column address bits Y0, Y1, . . . , Ym, but also to the EVEND and ODDD outputs of selectors 86, 86a. Suppose that two columns including a damaged column are to be replaced with spare columns, for purposes of explanation. The EVEND signal is initially at the "L" level; it rises to the "H" level if a column-select line CSL at an even-numbered position is replaced with spare column SCSL0. On the contrary, ODDD signal becomes at the "H" level if a column-select line CSL at an odd-numbered position is replaced by spare column-select line SCSL1. In response to EVEND, ODDD, the driver section of the decoders 84, 84a determines whether a specific output of main column decoder 84 is sent to a corresponding column-select line CSL, or a suitable output of spare column decoder 84a is sent to one of the spare-column-select lines, SCSL0 or SCSL1.

The important feature of decoders 84, 84a is as follows. The signals EVEND, ODDD from column-select/spare-column-select circuit 86, 86a are introduced not to the address decoder section but to the driver section, which is arranged near connection nodes with column-select lines CSL and spare column-select lines SCSL. With such an arrangement, even when the spare column is selected, a select line for the damaged column can be forced in the "no select" state while a look-ahead signal in the column decoder is kept active. Accordingly, in a spare-column-select cycle, a column-select line to be selected in the next cycle can be set in the "select" status in advance, in the manner as in selecting a normal column, by employing a look-ahead signal $\overline{\text{CLAn}}$ generated in the address decoder section of a damaged column.

The main column-select operation of DRAM 80 is equivalent to that of the previous embodiment 10 of FIGS. 1 to 4. The operation of "advance selection" of a redundancy columns using the look-ahead feature of the invention will be described below.

In the timing diagram of FIG. 10, it is assumed that two damaged columns CSLn and CSLn+1 are replaced with spare-column-select lines SCSL0, SCSL1, respectively, for the purpose of explanation. Two cell data bits are selected by one column-select line CSL or spare-column-select line SCSL. In the fifth and sixth cycles of $\overline{\text{CAS}}$ a bit connected to spare column-select line SCSL0 is selected; a redundancy bit connected to spare column-select line SCSL1 is selected in the seventh and eighth $\overline{\text{CAS}}$ cycles.

In the first cycle of $\overline{\text{CAS}}$ a column-select line CSLn−2, which is determined by an external column address, and a column-select line CSLn−1 are potentially activated together. Column-select line CSLn−1 is determined by an address preceding, by one, the address for the present cycle. As a result, four data bits are transferred to data-latch registers 46 to be latched therein. As the second $\overline{\text{CAS}}$ cycle ends, the column address counter installed on the chip of DRAM 80 increases its internal address. In FIG. 10, the lowest column address Y0 is incremented, changing from "L" to "H." Thus, the output of subtractor 92, i.e., an address held in fuse-data register 94, matches an internal address. This means that the damaged-column address held in register 90 becomes identical in value with the internal address by the next increment of the column address counter. At this time, only EVEND line 100 of the lines 100, 102 changes from "L" to "H" level to start the look-ahead operation on spare column-select line SCSL0.

At the end of the fourth cycle of $\overline{\text{CAS}}$, the column address counter once more increments its count value by one. The value of register 90 matches with the internal address. The ODDD line 102 now rises to the "H" level. Spare column-select line SCSL1 is also subjected to the "look-ahead" processing. At the end of the sixth $\overline{\text{CAS}}$ cycle, the column address counter counts up its value by one again, and then EVEND changes from "H" to "L" level. Spare column-select line SCSL0 is non-selected; at the same time, column-select line CSLn+2 is "look-ahead" processed. When the column address counter counts up its value by one at the end of eighth $\overline{\text{CAS}}$ cycle, the ODDD also drops to the "L" level. The spare column-select line SCSL1 is not selected. Column-select line CSLn+3 is then look-ahead processed. This competes the cycle of selecting the spare-column-select lines. Thereafter, the look-ahead operation in the main column decoder 84 will be repetitively executed in the manner as described previously.

Figure 11:
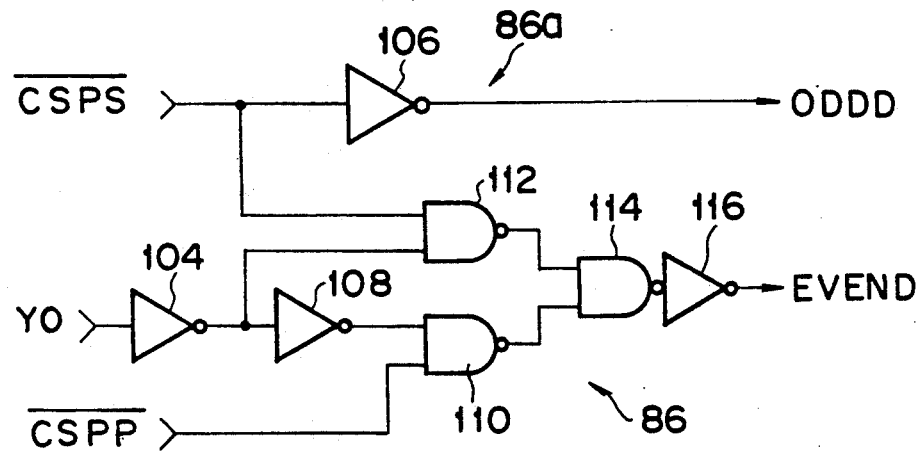
FIG. 11 is a diagram illustrating the internal arrangement of a column-select circuit in FIG. 9.

The column-select/spare-column-select circuits 86, 86a may be arranged as shown in FIG. 11. An inverter 104 is connected to an input of the lowest-level address Y0. Another inverter 106 is connected to a signal $\overline{\text{CSPS}}$ input. The $\overline{\text{CSPS}}$ is the comparison result between the storage value of register 90 and a current internal address; it is normally at the "H" level, and drops to the "L" level only when any couple of addresses except address Y0 are identical with each other. The output of inverter 104 is connected via an inverter 108 to one input of a NAND gate 110. The other input of NAND gate 110 is connected to a signal $\overline{\text{CSPP}}$ input. The $\overline{\text{CSPP}}$ is indicative of the comparison result between the storage value of register 92 and a current internal address; it is normally at the "H" level, and drops to the "L" level only when any pair of addresses except address Y0 are identical to each other. Another NAND gate 112 has the first input connected to the output of inverter 104, and the second input connected to $\overline{\text{CSPS}}$ input. The outputs of NAND gates 110, 112 are connected to a NAND gate 114, which has its output connected to an inverter 116. The ODDD signal appears at the output of inverter 106, whereas EVEND arises at the output of inverter 116.

Figure 12:
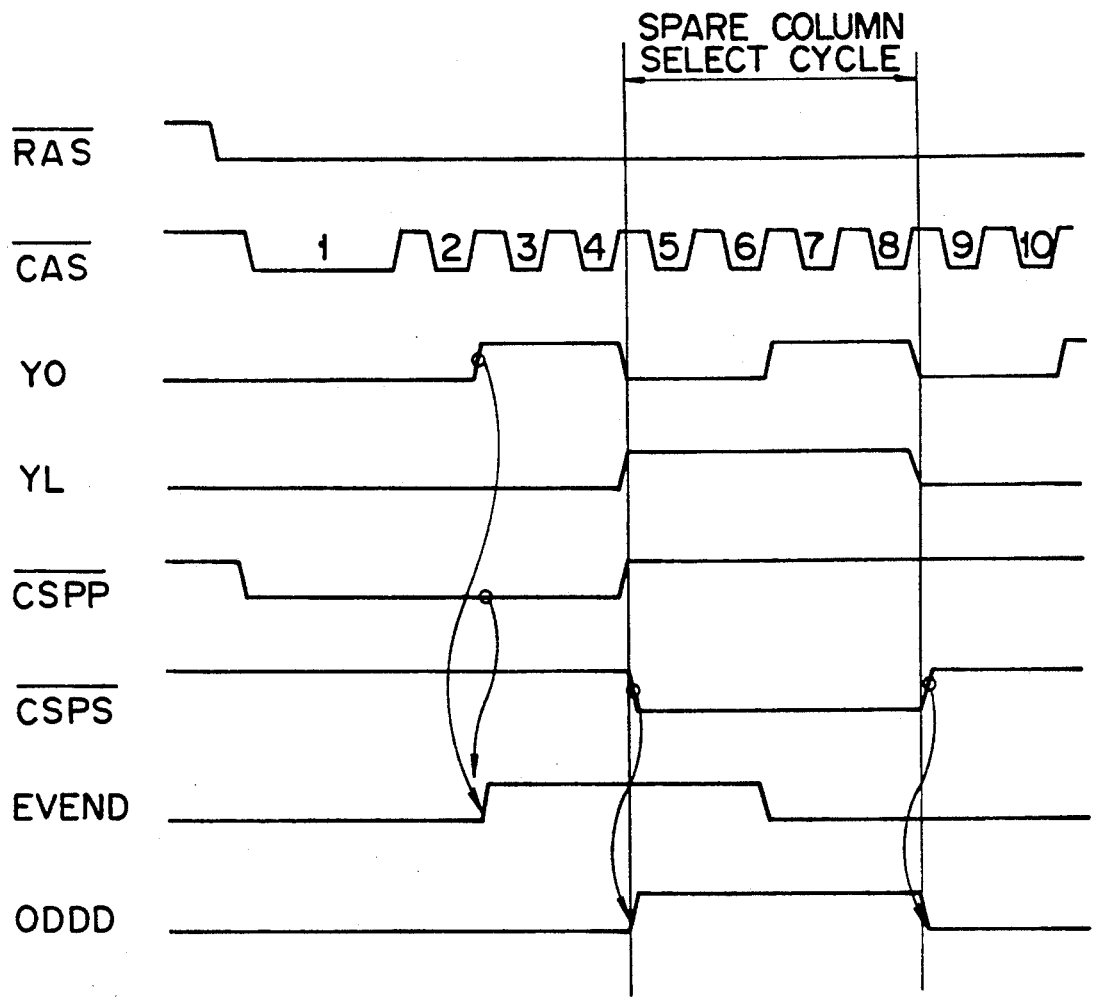
FIG. 12 is a timing diagram showing the pulsing sequences of the circuit shown in FIG. 11.

As apparent from the timing diagram shown in FIG. 12, the ODDD signal is reverse in phase to $\overline{CSPS}$. The EVEND signal is normally at the "L" level; it becomes at the "H" level only when the following conditions are satisfied:

(1) Y0 is "H" and $\overline{CSPP}$ is "L".
(2) Y0 is "L" and $\overline{CSPS}$ is "L".

Employing such a signal also enables spare-column-select lines SCSL to be provided with the "look-ahead" function of the invention.

Figure 13:
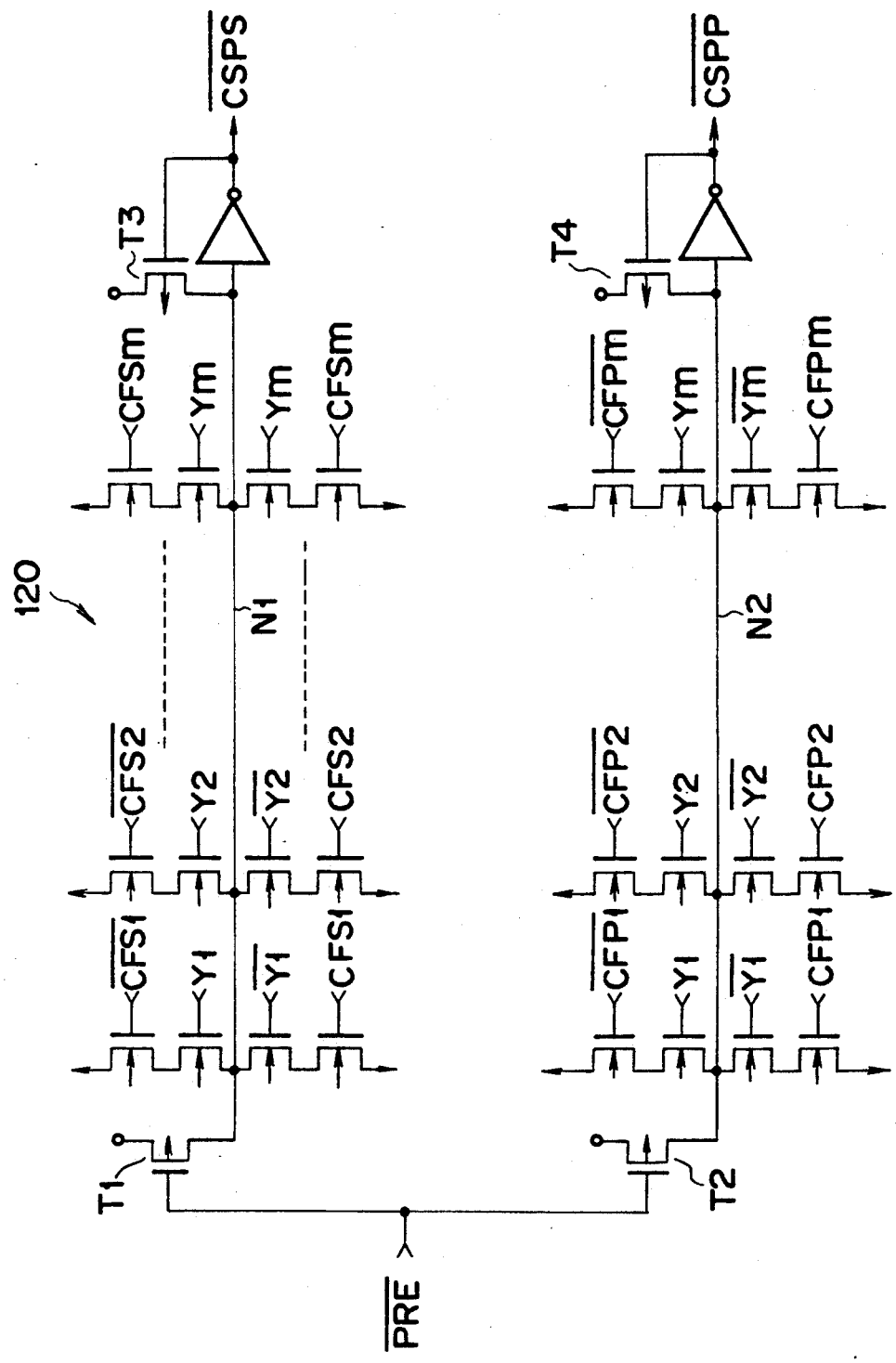
FIG. 13 is a diagram illustrating the structure of a recommendable comparator for generating compare signals $\overline{CSPS}$ and $\overline{CSPP}$ in FIG. 11.

A comparator circuit 120 suitable for generating the comparison signals $\overline{CSPS}$ and $\overline{CSPP}$ is shown in FIG. 13. The matching/non-matching between the fuse-data and the internal address may be realized by employing a plurality of wired-OR circuits each having two transistor series-circuits each of which consists of NMOS transistors with gate electrodes to which corresponding signals are supplied respectively. More specifically, only when every fuse data matches with a current internal address, $\overline{CSPS}$, $\overline{CSPP}$ are at the "L" level. PMOS transistors T1, T2, which receive a gate signal $\overline{PRE}$ at their gate electrodes, act as the charge-up devices for charging circuit nodes N1, N2. PMOS transistors T3, T4 control the potentials at nodes N1, N2 so as to prevent these nodes from being rendered electrically floating at any moment.

The subtractor 92 of FIG. 7 may be arranged as shown in FIG. 14, wherein the subtractor 92 includes an exclusive OR gate 130 and a NOR gate 132, each of which has inputs connected to signal CFSi, CCi inputs. The outputs of these gates are connected respectively to inverters 134, 136. CFSi is a signal which electrically represents an address being currently held in fuse-data register 90, where i=0, 1, 2, ..., m. CCi is a carry signal; CC0 is Vss. An address CFPi which is "1" subtracted from the address CFSi, is produced and is transferred to the fuse-data register 94. Using the desired number of the circuit arrangements of FIG. 14 may provide a subtracting circuit which has an arbitrary bit length.

Another DRAM 140 is shown in FIG. 15. This DRAM is similar to that of FIG. 7 with the subtractor 92 being replaced with a redundancy-column fuse 142, which is exclusive to the register 94. Fuse 142 executes an equivalent subtraction operation to that of subtractor 92, by cutting off a suitable one of fuse components causing a specific address to be transferred to register 94; the specific address is less by 1 than the address of a damaged column after decrement.

Figure 16:
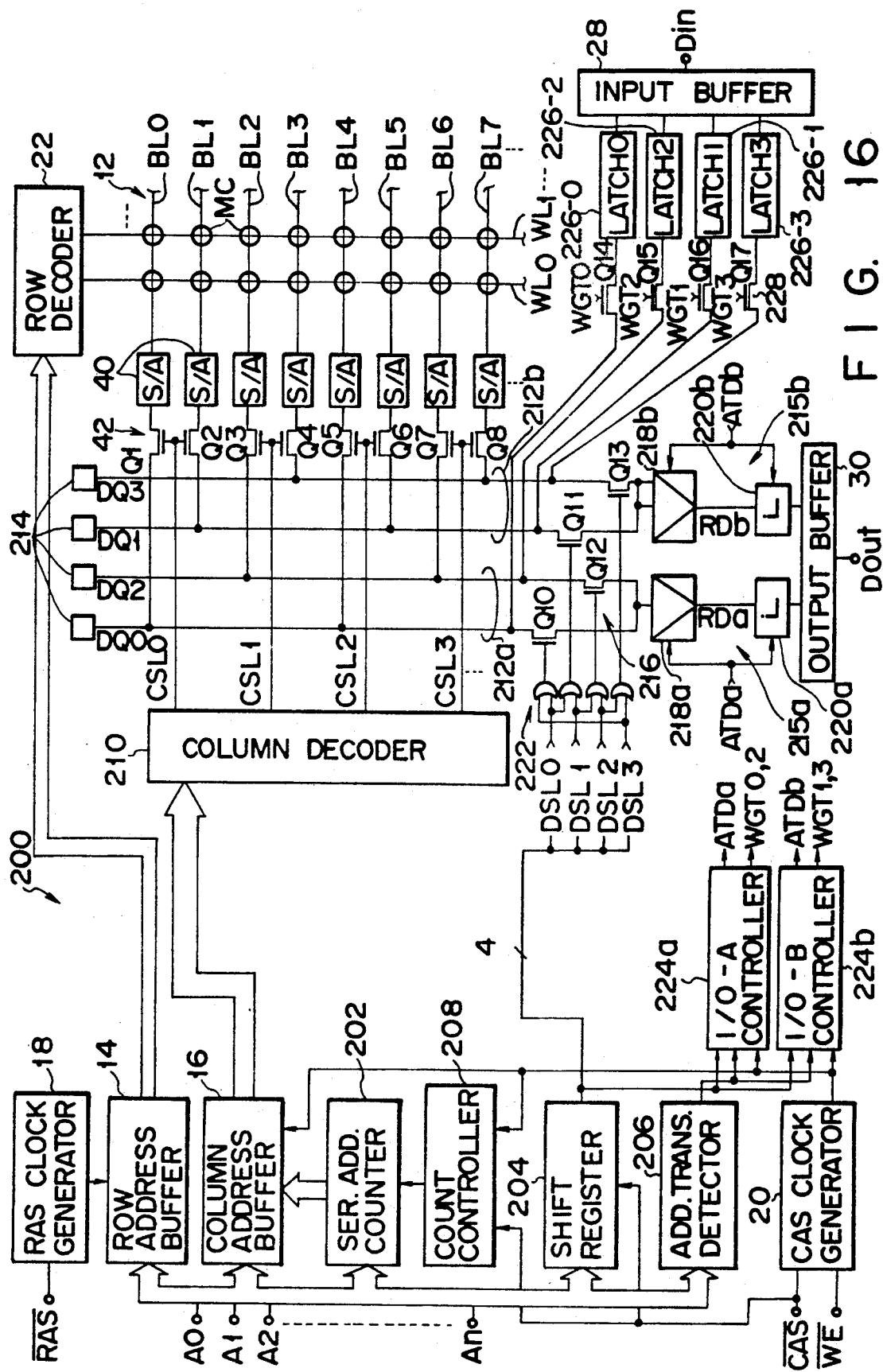
FIG. 16 is a schematic block diagram illustrating the circuit arrangement of the essential part of a MOS serial-access memory according to a further embodiment of the present invention.

Another DRAM 200 is shown in FIG. 16 wherein the DRAM employs a specific "interleave" technique for bit data transmission on I/O lines. DRAM 200 is similar to the previously described DRAMs 10, 80, 140 in its main internal arrangement including memory cell array 12, row and column address buffers 14, 16, RAS and CAS clock generators 18, 20, and sense amplifiers 40 associated with bit lines BL. Address bit inputs A0, A1, ..., An are also connected to a serial address counter 202, a 4-bit shift register 204, and an address transition detection circuit 206. Counter 202 executes a serial count operation to generate a series of column addresses under control of an address count controller 208 connected therewith. Controller 208 controls counter 202 so that each serial column address is generated every time when two toggles are made in $\overline{CAS}$. In a write cycle, counter 202 is made by controller 208 to hold its count results representing the updated selection of column-select lines CSL, until a write operation ends. Shift register 204 decodes the lower 2 bits of a column address to select one from among four data-select lines DSL0, DSL1, DSL2, DSL3.

A column decoder 210 has outputs connected by column-select lines CSL0, CSL1, CSL2, CSL3, ... to gate-coupled MOS field effect transistor (FET) pairs Q1–Q8, ... acting as the transfer gates 42. FETs Q1, Q2 have gate electrodes connected together to column-select line CSL0; the gate electrodes of FETs Q3, Q4 are connected in common to column-select line CSL1. Four I/O lines DQ0, DQ1, DQ2, DQ3 are associated with the transfer-gate FETs 42 so that every two adjacent gate-coupled transfer gates, i.e., every four FETs Q1, Qi+1, Qi+2, Qi+3, are sequentially connected to the I/O lines. For example, FETs Q1, Q2, Q3, Q4 are connected at their current-carrying electrodes to I/O lines DQ0, DQ1, DQ2, DQ3, respectively. Very importantly, I/O lines DQ are subdivided into two groups 212a, 212b: the first group A consisting of even-numbered line segments, and the second group B consisting of the odd numbered line segments. In this embodiment, FETs Q1, Q2 of the first transfer gate are connected to lines DQ0, DQ1; FETs Q3, Q4 of the second transfer gate are connected to lines DQ2, DQ3. The same goes with the remaining transfer gate FETs Q5–Q8, .... The first I/O group defines a "transfer system A," while the second group defines a "transfer system B."

Reset circuits 214 are arranged at the first ends of the I/O lines DQ, causing them to reset to the initial potential when required. The I/O lines DQ have the second ends that are connected to a data output section 215 via MOSFET transistors Q10–Q13 constituting a transfer gate 216 so that the system A transfer lines (I/O-A lines) 212a are connected via MOSFETs Q10, Q12 to the output section and that the system B transfer lines (I/O-B lines) 212b are connected thereto via MOSFETs Q11, Q13. The output section includes two I/O sense amplifiers 218a, 218b, which are respectively connected to the I/O-A, I/O-B lines 212a, 212b. The outputs of amplifiers 218a, 218b are connected to output buffer 30 through a pair of output data latch circuits 220a, 220b. The series circuit (215a) of amplifier 218a and latch 220a serves as a system A data transfer circuit; the series circuit (215b) of components 218b, 220b acts as a system B data transfer circuit. The gate electrodes of FETs Q10–Q13 are connected to a data transfer control circuit 222. An I/O-A control circuit 224a is connected to the system A data transfer circuit 215a, for providing it with a transfer pulse signal ATDa. Similarly, an I/O-B control circuit 224b provides the system B data transfer circuit 215b with a transfer pulse signal ATDb. The controller 224a, 224b control data transmission on the I/O-A and -B lines 212a, 212b (DQ) in response to the outputs of 4-bit shift register 204 and detector 206.

The I/O lines DQ0, DQ1, DQ2, DQ3 are also connected to the input buffer 28 through the corresponding number of, i.e., four, MOSFETs Q14–Q17, and the same number of latch circuit 226. FETs Q14–Q17 act as an input stage transfer gate section 228 for DRAM 200. Input data bits Din are sequentially latched by latches 226, and then developed onto I/O-A and -B lines 212a, 212b via FETs Q14–Q17. If desired, these latches 226 may be replaced with two latches, one of which is connected in common to I/O-A line segments 212a, and the other of which is connected to I/O-B line segments 212b.

The column decoder 210 operates responding to the column address input designating an j-th (j=1, 2, ..., n) column-select line CSLj. Using the aforementioned look-ahead function, decoder 210 potentially activates column-select line CSLj and its neighboring column-select line CSLj+1 simultaneously. At this time, since each of the column-select lines CSL is connected by transfer gates 42 to two adjacent bit lines BLi and BLi+1, four bit lines BL corresponding to the four consecutive columns are actually connected to I/O lines DQ0, DQ1, DQ2, DQ3. FETs Q10–Q13 of transfer gate 216 are driven as follows: FETs Q10, Q11 turn on first; Q11 and Q12 then turn on; Q12 and Q13 turn on; and, lastly, Q13 and Q10 turn on. The data bits in first and second latches 220a, 220b are transferred via output buffer 30 to data output Dout, from which they are sent forth alternately.

Figure 17A:
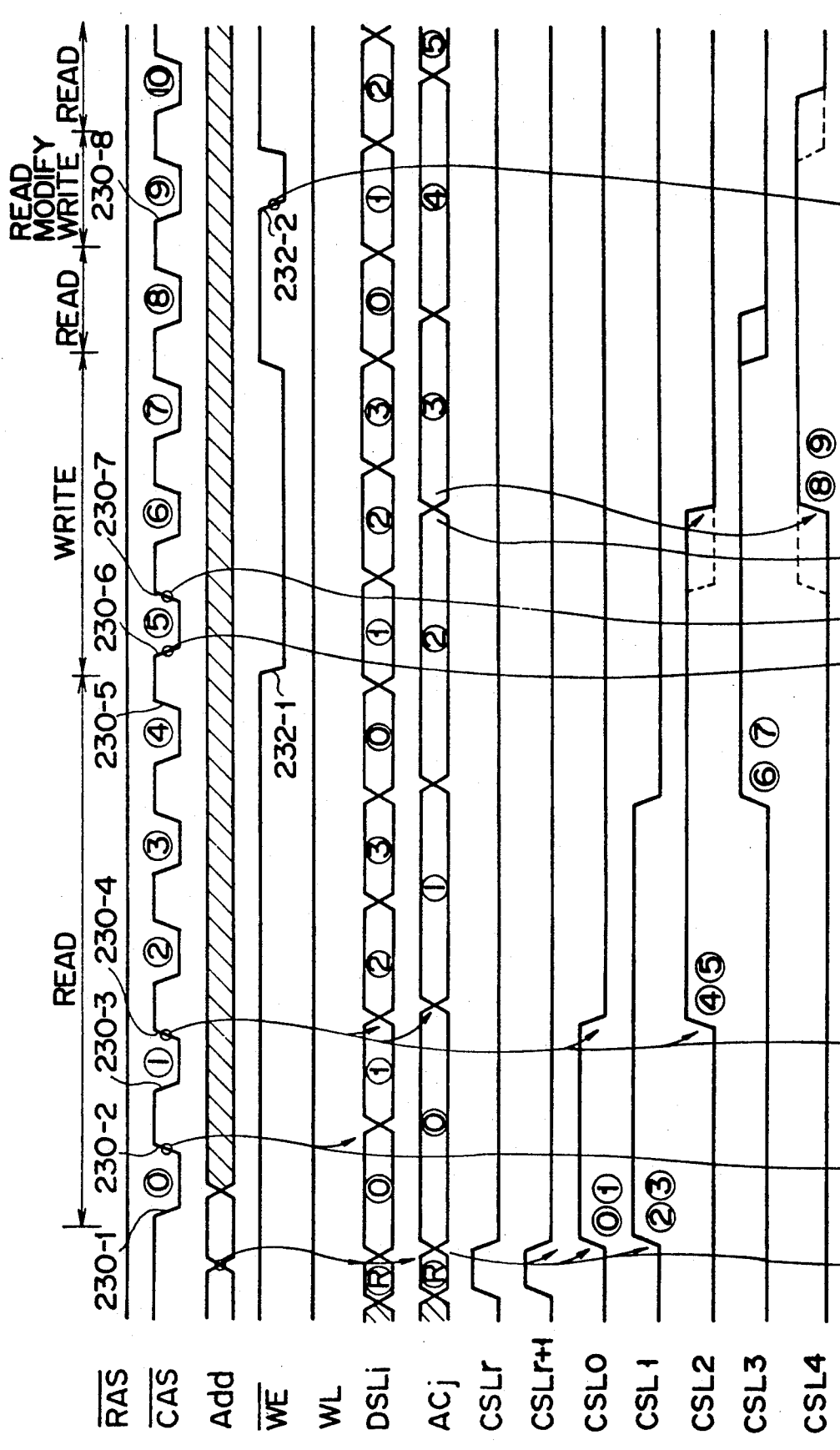
FIGS. 17A and 17B are timing diagrams illustrating pulse sequences for the operation of the embodiment shown in FIG. 16.
Figure 17B:
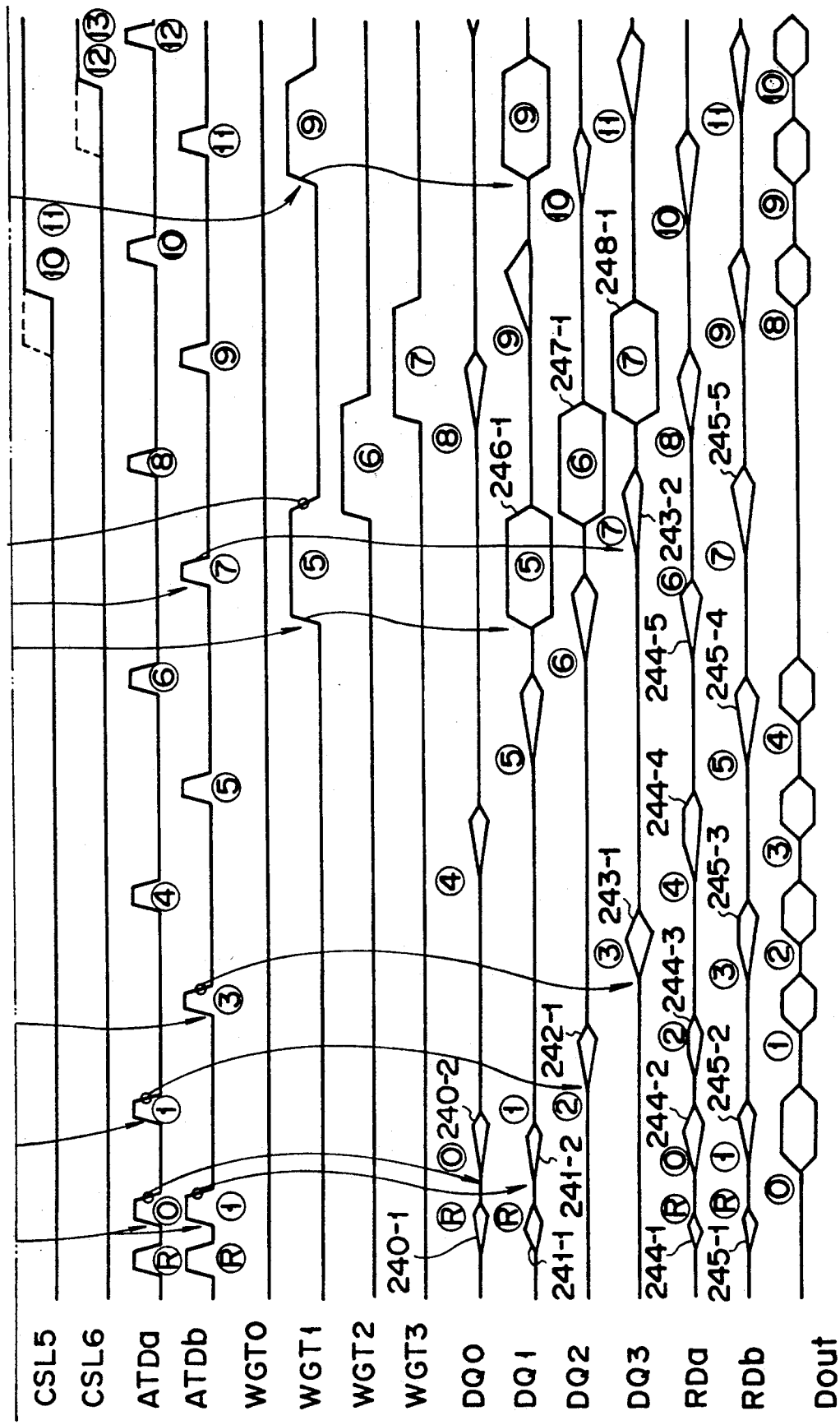

The operation of DRAM 200 is as follows. The associated pulsing sequence is shown in FIGS. 17A, 17B. For purposes of explanation DRAM 200 sequentially executes a read, a write, a read, a read-modify write, and a read operation in the named order during one of the $\overline{RAS}$ active cycles. In these timing diagrams circled numbers 0, 1, 2, ..., 10 are added to represent selection cycles of the bit lines BL.

First, a row address is fetched at the falling edge of an externally-supplied row address strobe $\overline{RAS}$, permitting a selected word line WL to be activated. Memory cell data for this row is read onto the bit line BL, and is amplified by bit line sense amplifier 40 before being latched. After the row address-fetch is completed, a column address is fetched. Before the column-address fetch, however, the column-select line CSLr for the same column address as the row address and the next column-select line CSLr+1 are activated simultaneously. Two bit-line data selected by line CSLr is transferred via data I/O lines DQ to output data latch circuits 220 through the first and second data transfer circuits 215a, 215b. The above operation corresponds to the "pre-phase" for selectively activating the column-select lines CSL one after another by the subsequent toggling of $\overline{CAS}$.

When the address input is switched from the row address to the column address, two column-select lines selected by this address are activated at a time. Assume that the column-select line CSL0 and the next column-select line CSL1 are simultaneously activated. At this time, the previously selected column-select lines CSLr, CSLr+1 are deactivated. Address transition detector 206 detects such address transition; controllers 224a, 224b generate data transfer pulses ATDa, ATDb. With these pulses used as triggers, the data on the two bit lines selected by column-select line CSL0 are simultaneously transferred over to data latch circuits 220a, 220b, by the system A and B data transfer 215a, 215b (see 240-2, 241-2, 244-2, 245-2 in FIG. 17B). The output of shift register 204 is in the state to select data-select line DSL0, FETs Q10, Q11 in select gate 216 are rendered conductive by controller 222, while the data transfer pulses ATDa, ATDb hold the "H" level until potential change of column-select line CSL is completed.

It is noted that the above operation is for the case wherein the input column address selects the lower bit of the two bits selected by CSL0 or the system A in terms of address. On the other hand, if the input column address selects the upper bit (system B) of column-select line CSL0, the upper bit of the two bits selected by column-select line CSL0 and the lower bit of the two bits selected by the next column-select line CSL1 are transferred simultaneously to the output data latch circuits. Referring to FIG. 17A, since the switching of the address input to the column address is made slowly with respect to the rising of the word line WL the column address data is transferred temporarily. Quickening the timing of address switch permits the column address data alone to be transferred from the beginning. Further, when an address switching is executed again before $\overline{CAS}$ rises, the column-select line CSL selected by the new address is activated, transferring the two-bit bit line data again. The above operation is substantially the same as that of a standard DRAM incorporating an ordinary fast-page mode.

When $\overline{CAS}$ falls as indicated by 230-1 in FIG. 17A, the input address data is latched as the "top column address" in serial address counter 202 and shift register 204. The data in data latch circuits 220a, 220b may be sent forth to the output Dout. The logical state of the lowest address bit (A0) determines which data is to be output, one in latch 220a or the other one in latch 220b. If A0 is "L," the data of system A will be output; if not (A0="H"), the system B data will be output. FIGS. 17A and 17B illustrate the case of A0="L" for purpose of explanation only. When $\overline{CAS}$ rises as shown by "230-2" in FIG. 17A, the select signal of shift register 204 is changed to switch the designated data-select line from DSL0 to DSL1. In the transfer gate section 216, FET Q10 of the system A turns off; alternatively, FET Q12 of the same system (A) turns on. FET Q11 of the system B is kept conductive. Here, the data of bit line BL2, which is selected by column-select line CSL1 that has already been activated by the previous transfer pulse ATDa, is transferred to latch 220a via I/O line DQ2 and data line RDa (see 244-1, 244-3 in FIG. 17B). The data transfer pulse ATDa generated at the rising of $\overline{CAS}$ may have a narrower width than the previous one ATDa generated by the address transition occurring before the fetching of the column address. This is because column-select line CSL has already been activated one cycle earlier.

As $\overline{CAS}$ potentially falls (230-3 in FIG. 17A), the data on bit line BL1, which has already been transferred to data latch 220b, is output. When $\overline{CAS}$ rises (230-4 in FIG. 17A), shift register 204 switches data-select line DSL1 to the next data-select line DSL2 and enables it. The then data on bit line BL3 is transferred to latch 220b via lines DQ3, RDb (243-1, 245-3 in FIG. 17B). At this time, the content of address counter 202 is incremented to change the selected column-select line CSL. As an example, column-select line CSL0 falls, and the column-select line CSL2 rises. During the potential changes, column-select line CSL1 holds its activated state.

Thereafter, a similar operation will be repeated in response to the toggle actions of $\overline{CAS}$. Through this operation, shift register 204 changes data-select line DSL once every $\overline{CAS}$ cycle to sequentially select four I/O lines DQ, so that data on the bit line connected to the selected line DQ is transferred alternately via the output data line RDa or RDb to the output data latch 220a or 220b. With attention paid to one column-select line CSL, the "select" state of this line CSL is held for four $\overline{CAS}$ cycles and it overlaps the adjoining column-select line CSL for two $\overline{CAS}$ cycles.

Through the above operation, in response to the consecutive togglings of $\overline{CAS}$, the column-select line CSL, which connects one bit line BL to the I/O line DQ for the select cycle of that bit line, begins rising at a specific time point that is three cycles before the rising of $\overline{CAS}$ for the system A; in the system B, four cycles before. The data transfer to the output section begins at a time that is two cycles before. Let's consider about select cycle (4) for selecting the bit line BL4, for instance. Column-select line CSL2 is activated at three-cycle before 5 the potential rising of $\overline{CAS}$; at two-cycle before, data transfer pulse ATDa is activated. In that select cycle, therefore, it is sufficient to output the data held in the output data latch circuit. As a result, read data for the systems A and B will continuously be output from the output Dout, thus ensuring fast serial access operation. In addition, since the read data is alternately transferred using the system A-data transfer circuit 215a and the system B-data transfer circuit 215b, data transfer is possible in a half the cycle required for the conventional device of single-transfer system type.

In a write period of DRAM 200, the $\overline{CAS}$ cycle enters in a write cycle by causing the write enable signal $\overline{WE}$ to be dropped to the "L" level before $\overline{CAS}$ drops to the "L" level in a similar manner as in standard-type DRAMs. $\overline{WE}$ falls as shown by "232-1" in FIG. 17A before the drop down (230-6) of the $\overline{CAS}$ cycle (5); and, $\overline{WE}$="L" is held until the $\overline{CAS}$ cycle (7) so that a continuous writing is executed. Although the $\overline{CAS}$ cycle (5) is a select cycle for the bit line BL5, the data on bit lines BL5, BL6 have already been transferred to the respective latches 220b, 220a in the above-described read operation until the activation of the $\overline{CAS}$ cycle (4) (230-5). The falling of $\overline{CAS}$ in this cycle (5) invokes the write operation; input data is thus fetched in the chip by the input buffer 28, and is latched in latch 226-1 in the input data latch circuit 226.

When the FET Q16 is rendered conductive by a gate control signal WGT1 in transfer gate section 228, transferring the latched data to I/O line DQ1 (246-1 in FIG. 17B). The data is carried onto bit line BL5 via FET Q6 selected by column-select line CSL2. The output of buffer 30 is in a high-impedance state. When $\overline{CAS}$ rises (230-7), the operation of address counter 202 is held by controller 208 until the data write is completed in this cycle, in contrast to the above read cycle where incrementing the content value of address counter 202 immediately begins to change the column-select line CSL. Note that in this write cycle too, shift register 204 is driven immediately at the rise of $\overline{CAS}$ to execute the read-data transfer as in the cycle (7) (243-2, 245-5 in FIG. 17B).

In the next $\overline{CAS}$ write cycles (6) and (7) also, a write data is sequentially latched in latches 226-2, 226-3. FETs Q15, Q17 of transfer gate 228 are rendered conductive, sending the write data onto bit lines BL6, BL7 via the respective I/O lines DQ2, DQ3 (247-1, 248-1 in FIG. 17B). In this manner the consecutive write operations can be "overlapped" by employing four or two input latches 226, thus ensuring writing of serial data in a shorter cycle.

During the above write operation, data bits on the bit lines obtained in select cycles (8) and (9) have been transferred to the output data latches 220 at the rise of $\overline{CAS}$. As shown in FIG. 17A, therefore, it is possible to output data immediately even when $\overline{CAS}$ cycle (8) is in read cycle ($\overline{WE}$="H").

In the next $\overline{CAS}$ cycle (9), a "read-modify write" operation is performed by causing $\overline{WE}$ to fall (232-2) later than the falling edge of $\overline{CAS}$ (230-8). In this cycle, data in latch 220b, which has already finished data transfer, is output in response to the falling of $\overline{CAS}$ (232-8). Then, as $\overline{WE}$ falls (232-2), the data is sent onto the associated bit line via I/O line DQ1 from the input data latch 226-1 (246-2 in FIG. 17B). The data is held even during this write operation.

According to the above embodiment, when a data input/output operation is made with respect to a certain column in a serial access mode, the specific column-select line CSL associated with the column is controlled by column decoder 210 so that it is forced to begin rising potentially at least three cycles before the time point at which a corresponding select cycle for the specific column will get started. The specific column-select line is also made to hold its "select" state until the read (or write) operation therefor is actually completed. The transmission of data read on a data input/output line segment corresponding to the column is forced to begin to be performed at least two cycles before the select cycle of the above column starts. Two continuous columns of data bits are alternately read out by the first and second data transfer gate sections 215a, 215b. A write operation is controlled to get started in the exact select cycle for the above column.

With such an arrangement, the column-select lines, which simultaneously select a corresponding two columns of bit line data, can be activated by column decoder 210 prior to the actual select cycle, so that the consecutive two column-select lines are selected substantially simultaneously. To facilitate this, DRAM 200 includes four data I/O lines DQ. In a read mode of the serial access operation, four consecutive columns of bit line data bits that have been selected by two column-select lines are distributed onto the four data I/O lines; these data bits can be alternately and continuously read out by the data transfer sections 215a, 215b of the two systems A and B. The same discussions may be applied to a write mode. The use of such an "interleave" technique can ensure fast serial access continuously in the column direction with an arbitrary point as a start address with respect to the entire memory cells selected by one word line without using a large-scale data register to thereby realize the read, write and read-modify write operations.

Figure 18:
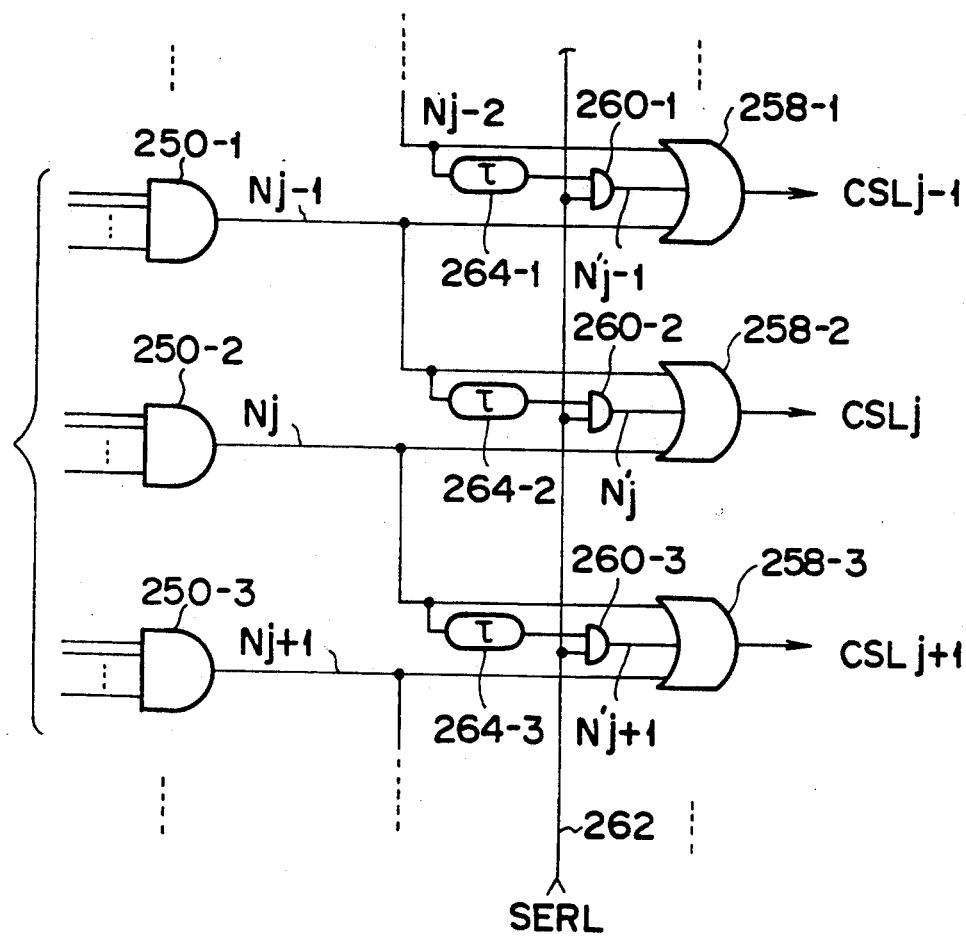
FIG. 18 is a diagram showing the internal arrangement of a column decoder of FIG. 16.
Figure 19:
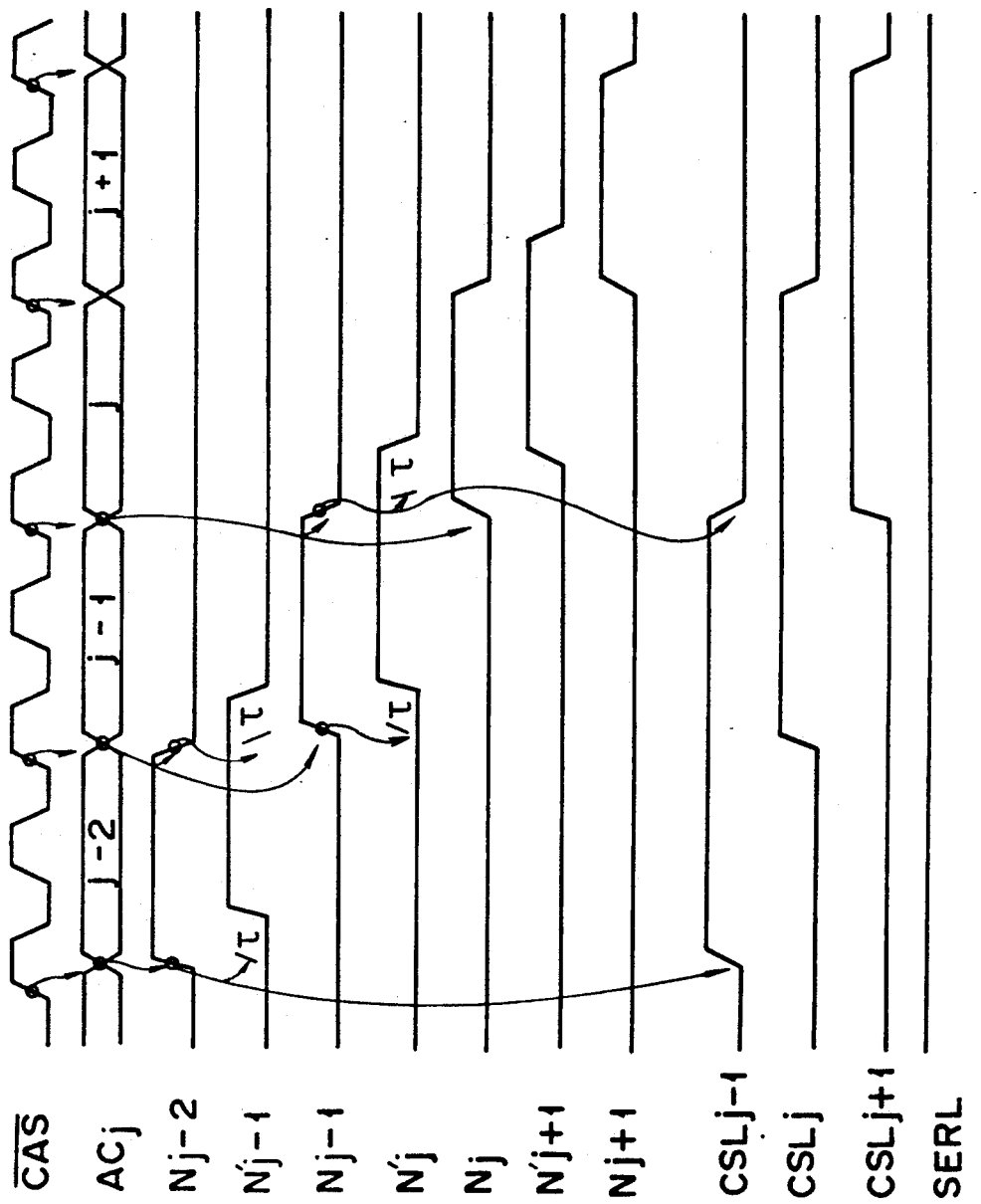
FIG. 19 is an illustration of a timing diagram showing pulse sequences of the same.

FIG. 18 illustrates a circuit configuration of the column decoder 210. FIG. 19 is the associated timing diagram. A plurality of multi-input AND gates 250-1, 250-2, 250-3, . . . are arranged to decode the column address. AND gates 250 have output nodes N respectively connected to the first inputs of three-input OR gates 258-1, 258-2, 258-3, . . . . Each OR gate 258 has second inputs connected to the first input of the OR gate positioned at the previous stage. For instance, the second input of OR gate 258-2 is connected to the first input of OR gate 258-1. OR gates 258 are provided with AND gates 260 respectively. Each OR gate 260 has a first input connected to a control signal (SERL) line 262, a second input connected via a delay circuit 264 (serving as a noise eliminator) to the output of multi-input AND gate 250, and an output connected to the third input of the associated three-input OR gate 258. The outputs of OR gates 258 are connected to column-select lines CSL, respectively. Responding to an input column address, one of the output nodes Nj (j=1, 2, . . ., n) of AND gates 250 becomes at the "H" level. Such potential change of node Nj causes OR gate 258-2 and its following OR gate 258-3 to be activated simultaneously.

The column decoder 210 of FIG. 18 operates as follows. As shown in FIG. 19, the column address ACj increases by one for two toggles (two cycles) of $\overline{CAS}$. In synchronism with this column address increment, the output nodes Nj−1, Nj, Nj+1, . . . changes at the "H" level in the named order. For instance, since the column-select line CSLj is activated by the OR operation of the nodes Nj−1 and Nj, the column address is kept at the "H" level from j−1 to j. At the time of transition to j from j−1, however, whisker noise may occur. The phase of the signal of the node Nj−1 is delayed by delay circuit 264-2, so that this signal partially overlaps the signal of node Nj, thereby preventing the whisker noise from occurring.

The control signal SERL to be input to AND gates 260 becomes the "H" level in the serial access mode, and becomes the "L" level in other operations. In serial access mode, therefore, delay circuit 264 operates as described above to inhibit the occurrence of whisker noise. Since SERL is kept at the "L" level in other modes, the node Nj' becomes the "L" level by AND gate 260-2, so that OR gate 258-2 will not be influenced by delay circuit 264-2. In other words, column-select line CSLj is directly driven by the voltage signals at nodes Nj, Nj−1. This is because that in other modes than the serial access mode, the address switching is not necessarily performed on consecutive addresses, and multi-selection of column-select lines including an unnecessary column-select line will occur if delay circuit 264 is kept active.

For instance, when the column address is changed to ACm from ACn, the column-select lines are changed to lines CSLm, CSLm+1 from CSLn, CSLn+1. As resetting of node Nn+1' is delayed with the control signal SERL="H" then, the multi-selection of column-select lines CSLn+1 and CSLm (or CSLM+1), which causes a problem in circuit operation. This control signal SERL is controlled in such a way as to be the "L" level at the precharge time, become the "H" level after a predetermined delay time $\tau$ from the first falling edge of $\overline{CAS}$, and keep the "H" level in response to the following toggling of $\overline{CAS}$, for example.

FIG. 20 exemplifies the internal configuration of the data output section shown in FIG. 16, namely the output data latch circuits 220a, 220b and output buffer 30 in the data transfer circuits 215a, 215b. Data latch circuit 220a of the system A comprises latch circuits 270-1, 270-2 provided in a pair of data output lines RDa, $\overline{RDa}$ connected to the two output nodes of I/O sense amplifier 218a. Data latch circuit 220b of the system B likewise includes two latch circuits 270-3, 270-4. The output buffer circuit 30 includes an output FET Q50 of the P-channel type, an output FET Q51 of the N-channel type, a P-channel reset FET Q52, and an N-channel reset FET Q53, all common to the systems A, B.

FIG. 21 presents the associated waveform diagram of the data output section of FIG. 20. Complementary data for the system A and complementary data for the system B are fetched respectively in data latch circuits 220a, 220b by respectively setting latch signals LATCHa and LATCHb to the "H" level. These data are latched therein by respectively setting the latch signals LATCHa, LATCHb to the "L" level. By alternately setting signals ENBLa, ENBLb to the "H" level, the latched data bits are sequentially output by FETs Q50, Q51 in the specified order. As shown in FIG. 21, a reset signal RESET is set at the "H" level when a system change is made between the systems A and B, thereby causing FETs Q50, Q51 to turn off and wait for the next data output. This may reduce the penetrating current and ensures fast switching of output data.

Figure 22:
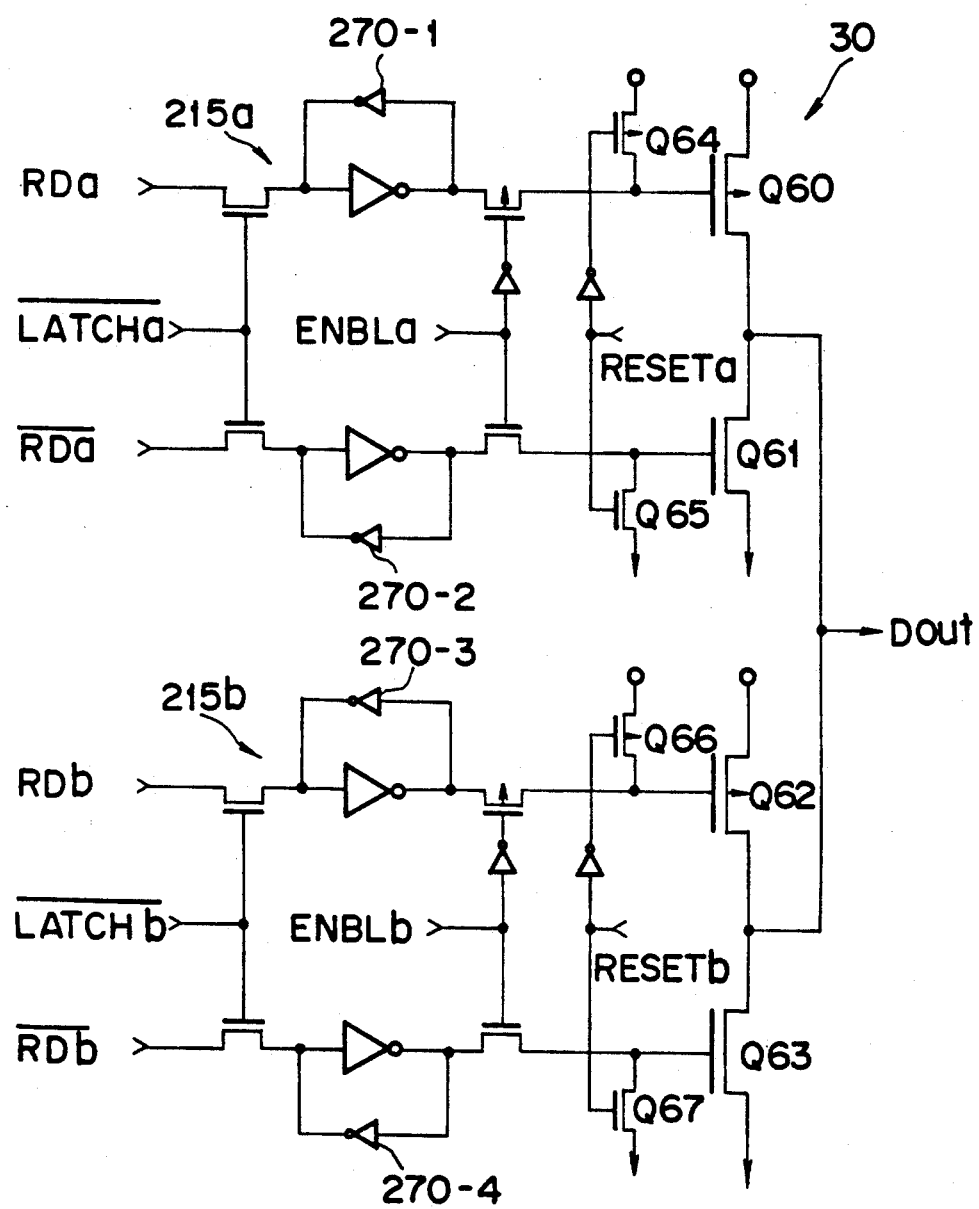

Another arrangement of the data output section is shown in FIG. 22, wherein the output buffer 30 is provided separately for the systems A and B. More specifically, the system A is provided with a P-channel type output FET Q60, an N-channel type output FET Q61, and reset FETs Q64, Q65 respectively connected to the gates of FETs Q60, Q61. The system B is provided with a P-channel output FET Q62, an N-channel output FET Q63, and reset FETs Q66, Q67 respectively connected to the gates of FETs Q62, Q63.

The associated pulsing sequences of the FIG. 22 circuit is shown in FIG. 23. With this circuit arrangement for the output section, since two identical circuits can be prepared and their control clocks can be prepared by the same circuits, the output section may be easily realized by employing an ordinary circuit arrangement of no serial access function. In addition, since the reset signal need not have a pulse shape as shown in FIG. 21, ensuring faster data switching.

Figure 24:
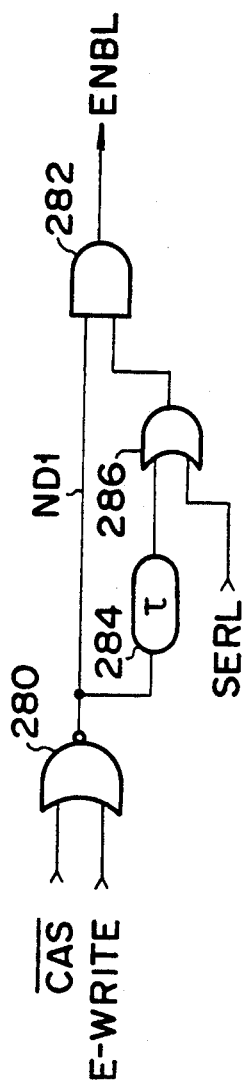
FIG. 24 is a diagram showing a circuit arrangement for generating an output enable signal used in the DRAM of FIG. 16.

FIG. 24 exemplifies a circuit to generate the output enable signal ENBL according to the present invention. In this figure "E-WRITE" is an output disable signal which is at the "H" level in early write mode. The ENBL signal generating circuit includes a NOR gate 280, which receives E-WRITE and $\overline{CAS}$, an AND gate 282 having one input terminal connected to the output node ND1 of NOR gate 280, a delay circuit 284 arranged between node ND1 and the other input terminal of AND gate 282, and an OR gate 286. Delay circuit 284 is arranged to delay the generation of the enable signal ENBL in response to the falling of $\overline{CAS}$ for the purpose of preventing the generating circuit from malfunctioning. OR gate 286 serves to disable delay circuit 284 in a serial access mode.

Figure 25:
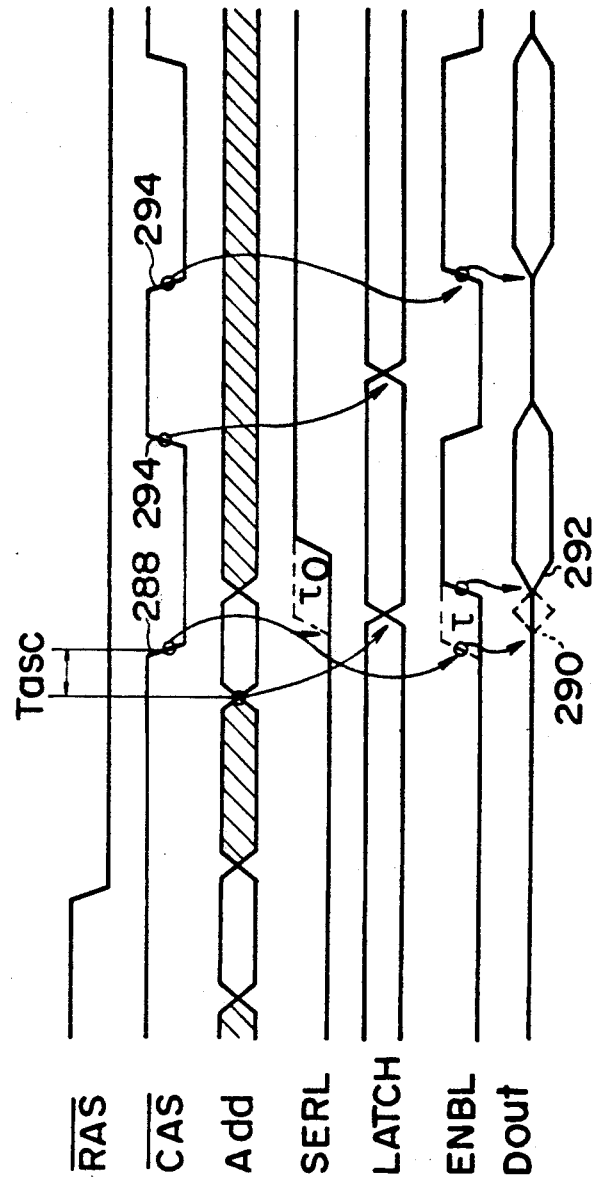
FIG. 25 is the associated timing diagram of the circuit shown in FIG. 24.

FIG. 25 shows the associated pulsing sequences of the enable-signal generator circuit of FIG. 24. In a read mode, E-WRITE="L", so that a phase-inverted signal of $\overline{CAS}$ appears at output node ND1 of OR gate 280. When the enable signal ENBL that is acquired via AND gate 282 is at the "H" level, the output data latch circuit is connected to the output buffer FET, so that data is output. Assume that the input timing of the column address is close to the first falling edge (288 in FIG. 25) of $\overline{CAS}$, and the address setup time Tasc is close to 0. When the enable signal ENBL rises in response to the falling of $\overline{CAS}$, erroneous data before transition of the column address is temporarily output (290 in FIG. 25), then true data is read out (292 in FIG. 25). Such a function drastically changes the output data, generating large noise which may cause other circuits to malfunction. Delay circuit 284 is provided to prevent such an event; it obtains an AND of the signal at node ND1 and the signal passing through delay circuit 284, thus delaying the generation of the enable signal ENBL by $\tau$ in response to the falling of $\overline{CAS}$. In the serial cycle (after two cycles of $\overline{CAS}$), data is switched at the rise of $\overline{CAS}$ (294 in FIG. 25) and new data will have already been latched in the output latch circuit when $\overline{CAS}$ falls next (296 in FIG. 25). It becomes unnecessary to provide a delay between this $\overline{CAS}$ and ENBL. In serial mode, therefore, the control signal SERL rises to set delay circuit 284 inactive; enable signal ENBL rises in synchronism with the falling of $\overline{CAS}$, thus ensuring fast accessing.

The present invention is not limited to the particular arrangement of the embodiments illustrated in FIGS. 16-25. For instance, although $\overline{CAS}$ is used as a sync clock of a serial cycle, another clock signal may be used as well. In addition, although the "read-modify write" is executed by delaying the falling of the write enable signal $\overline{WE}$ in response to the falling of $\overline{CAS}$ in the embodiment, another control pin may be used as a read-modify write enable signal.

FIG. 26 shows an example of a control circuit 300 that generates the output enable signal ENBL and write signal WRITE in the case where the DRAM package has an exclusive pin, which is used to control the read-modify write operation. In order to detect the falling of $\overline{CAS}$ and output the output enable signal ENBL when the write enable signal $\overline{WE}$ has the "H" level, a flip-flop 302 is provided which receives $\overline{CAS}$, $\overline{WE}$ through inverters 304, 306, respectively. One output of flip-flop 302 becomes, via the inverter 308, an output terminal for output enable signal ENBL. $\overline{RMWE}$ is an input signal coming from the exclusive pin added for the read-modify write operation. Further, an NOR gate 310 for acquiring an NOR of $\overline{CAS}$ and $\overline{WE}$, and an NOR gate 312 for acquiring an NOR of $\overline{CAS}$ and $\overline{RMWE}$ are provided in such a way that the outputs of NOR gates 310, 312 are to be output as signal WRITE via an OR gate 314.

FIG. 27 is a timing diagram for explaining the operation of this control circuit. The flip-flop 302 selects either "write" or "read-modify write" depending on the order of the falling $\overline{CAS}$ and write enable signal $\overline{WE}$. This will be described in detail below. When $\overline{CAS}$ falls with $\overline{WE}$, $\overline{RMWE}$ kept at the "H" level (cycle (1)), flip-flop 302 detects this event and sets the enable signal ENBL to the "H" level, thus setting the read mode. When $\overline{WE}$ falls before $\overline{CAS}$ falls with $\overline{RMWE}$ kept at the "H" level, ENBL remains the "L" level and no data is output. As a result, the output of NOR gate 312 becomes the "H" level, causing write signal WRITE to rise to set the write mode ($\overline{CAS}$ cycle (2)). When $\overline{WE}$ falls after $\overline{CAS}$, ENBL rises so that data is output. Further, the falling of $\overline{WE}$ renders the output of NOR gate 310 the "H" level, setting write signal WRITE to the "H" level, so that write operation is performed in a parallel manner ($\overline{CAS}$ cycle (3)). This operation is the read-modify write controlled by $\overline{WE}$ as has already been described earlier with reference to the previous embodiment. When the control signal $\overline{RMWE}$ from the exclusive pin is rendered to fall instead of $\overline{WE}$, the falling of $\overline{CAS}$ sets both the enable signal ENBL and write signal WRITE to the "H" level, also setting the read-modify write mode that permits parallel data output and data writing ($\overline{CAS}$ cycle (4)).

Since the writing operation is invoked by the falling of $\overline{CAS}$ in read-modify write mode as in $\overline{CAS}$ cycle (4), the duration of the write signal WRITE being at the "H" level in the same $\overline{CAS}$ cycle period is longer as compared with that in $\overline{CAS}$ cycle (3). In other words T4> T3 as shown in FIG. 27. The read-modify write mode involving the exclusive pin has greater allowance for the operation than the same mode in the previous embodiment.

The present invention may also be applied to various types of memory devices other than the DRAMs, such as SRAMs or PROMs, as well. Furthermore, the above systems A and B may be subdivided into a larger number of systems, such as four, eight, and so forth.

What is claimed is:

1. A memory system comprising:
    an array of memory cells arranged in rows and columns;
    row decoder means connected to rows of memory cells, for selecting one of the rows of memory cells in response to a row address signal supplied thereto;
    column decoder means connected to columns of memory cells, for designating a certain column in response to an input column address signal supplied thereto;
    said column decoder means comprising activation means for, when said certain column is activated, potentially activating a neighboring column of said certain column before actual arrival of a corresponding column address of said neighboring column;
    address counter means connected to said column decoder means, for starting a count operation in response to a column address-strobe signal, and for generating internal column addresses in a predetermined order;
    register means for temporarily holding information bits stored in those of said one of said rows of memory cells which are associated with said certain column and said neighboring column, and for selectively sending forth proper information bits when said corresponding column address actually arrives, wherein said register means is responsive to said address counter means, and outputs said information bits held therein in a serial manner in response to said internal column addresses; and
    column-select lines connected at first ends to outputs of said column address means, and connected at second ends to a plurality of adjacent columns, whereby information bits stored in at least four adjacent memory cells are simultaneously transferred to said register means.

2. A dynamic memory device comprising:
    an array of rows and columns of memory cells each of which includes a storage capacitor and a MOS transistor;
    control lines connected to the rows of memory cells;
    data transfer lines associated with the columns of memory cells;
    sense amplifiers having inputs connected to each column;
    transfer-gate devices having control electrodes, said transfer-gate devices being arranged at outputs of said sense amplifiers, for selectively turning on to allow a binary information bit appearing on a corresponding data transfer line to pass therethrough;
    row decoder means connected to said control lines, for specifying a selected control line in response to an external address input;
    column decoder means connected to said transfer-gate devices, for selectively activating said transfer-gate devices to designate a selected data transfer line in response to an input column address externally supplied thereto;
    said column decoder means causing, when turning on a certain transfer-gate device associated with said selected data transfer line, a specific transfer-gate device which neighbors on said selected data transfer line and which is associated with another data transfer line to be serially accessed next to turn on before a column address of said specific transfer-gate device actually arrives at said column decoder means;

latch means connected to outputs of said transfer-gate devices, for receiving information bits transferred via said certain transfer-gate device and said specific transfer-gate device, and for temporality latching the information bits; and means connected to said latch means, for sequentially generating the latched information bits in a serial manner.

3. A memory device according to claim 2, further comprising:

a plurality of column-select lines each of which has a input connected to said column decoder means and outputs connected to the control electrodes of those of said transfer-gate devices which are adjacent to each other.

4. A memory device according to claim 3, further comprising:

wire means for transferring a plurality of information bits arriving via said transfer-gate devices to said latch means in a parallel manner.

5. A memory device according to claim 4, further comprising:

serial counter means associated with said column decoder means, for generating internal column addresses that specify an order of accessing those memory cells connected to said selected control line.

6. A memory device according to claim 4, wherein said decoder means comprises:

an array of multi-input gate circuits having inputs connected to column address lines and outputs;

an array of two-input gate circuits connected to the outputs of said multi-gate circuits respectively; and each of said two-input gate circuits having a first input connected to an output of a corresponding one of said multi-input gate circuits and a second input connected to one input of a neighboring two-input gate circuit that is positioned at a one-preceding address location, whereby, when a multi-input gate circuit is selected, two two-input gate circuits is rendered active.

7. A dynamic memory device comprising:

an array of memory cells in rows and columns;

redundant memory cells in spare columns;

row decoder means connected to the rows of memory cells, for selecting one of the rows of memory cells in response to a row address signal input;

column decoder means connected to the columns of memory cells and said spare columns, for selecting a certain column from among the columns including said spare columns in response to a column address signal input;

said column decoder means comprising activation means for, when activating said certain column, also activating a column adjacent to said certain column before actual arrival of a corresponding column address thereof, wherein said column decoder means further comprises:

spare column selector means for specifying among said spare columns a proper column that replaces a damaged column; and spare column decoder means connected to said spare column selector means, for potentially activating said proper column before a corresponding address thereof is externally supplied.

8. A device according to claim 7, wherein said spare column decoder means comprises:

means for holding an address of the damaged column; and subtractor means for computing an address preceding that of said damage column by one, and for holding it therein.

9. A dynamic memory device comprising:

an array of memory cells in rows and columns;

row decoder means connected to the rows of memory cells, for selecting one of said rows of memory cells in response to a row address signal supplied thereto;

sense amplifiers connected to the columns of said memory cells, for outputting sensed data signals;

column-select line means connected to every pair of said sense amplifiers, for selecting a first number of neighboring columns simultaneously;

data transfer line means connected to said sense amplifiers, for sending forth the outputs of said sense amplifiers;

said data transfer line means comprising a second number of line segments which include a first group of line segments associated with alternate ones of said columns of said memory cells and a second group of line segments associated with the rest of said columns of said memory cells, each of the first and second groups of line segments having the first number of parallel line segments;

column decoder means connected to said column-select line means, for designating a certain column in response to an input column address signal externally supplied thereto, and for, when activating said certain column, potentially activating a column adjacent to said certain column before a corresponding column address thereof actually arrives, thereby allowing output signals of two adjacent pairs of sense amplifiers to be developed simultaneously onto said second number of line segments; and output means connected to said data transfer line means, for alternately selecting the sensed data signals on said first group of line segments and those on said second group of line segments, and for serially and externally sending forth the second number of selected data signals.

10. A device according to claim 9, further comprising first transfer gate means arranged between said sense amplifiers and said column-select lines, for being responsive to selection of a column-select line, and for causing two neighboring sense amplifiers to be simultaneously connected with corresponding data transfer line segments of one of said first and second groups of line segments.

11. A device according to claim 10, wherein said output means comprises:

second transfer gate means connected to said data transfer line means, for alternately selecting data signals that appear on said first group of line segments, for alternately selecting data signals appearing on said second group of line segments, and for alternately selecting the selected data signals on said first and second groups of line segments.

12. A device according to claim 11, wherein said output means comprises:

data latch means connected to said second transfer gate means, for temporarily holding said selected data signals therein and sequentially outputting said selected data signals in a predetermined order within a limited period of time.

13. A device according to claim 12, wherein said data latch means comprises:
a first latch circuit connected to said first group of line segments; and
a second latch circuit connected to said second group of line segments.

14. A serial-access memory system comprising:
an array of memory cells arranged in rows and columns;
row decoder means connected to the rows of memory cells for selecting one of the rows of memory cells in response to a row address signal externally supplied thereto;
column decoder means connected by column select lines to the columns of memory cells, for serially decoding columns in a predetermined order by designating a certain column presently selected in response to an input column address signal externally supplied thereto; and
said column decoder means comprising column activation means for potentially activating a column select line corresponding to the selected column in one of a series of read cycles defined by an external column address strobe signal which potentially changes alternately or toggles between first and second levels, and for simultaneously activating or preactivating another column select line neighboring thereto during said one cycle, thereby allowing said another column select line to be completed in activation before the column strobe signal enters a subsequent read cycle.

15. A memory system according to claim 14, further comprising:
address counter means connected to said column decoder means, for starting a count operation in response to the column address strobe signal, and for generating internal column addresses in the predetermined order in synchronism with the column address strobe signal.

16. A memory system according to claim 15, further comprising:
latch means for temporarily holding information bits stored in those of said one of the rows of memory cells which are associated with said selected column select line and said another column select line, and for selectively sending forth proper information bits in a corresponding read cycle of the serial read operation.

17. A memory system according to claim 16, wherein said latch means is responsive to said address counter means, and outputs said information bits held therein in a serial manner in response to said internal column addresses.

18. A memory system according to claim 17, wherein said column-select lines are connected at first ends to outputs of said column address means, and connected at second ends to a plurality of adjacent columns, whereby information bits stored in at least four adjacent memory cells are simultaneously transferred to said latch means.

19. A memory system according to claim 14, further comprising:
redundant memory cells arranged in spare columns, said column decoder means connected to columns of memory cells and said spare columns.

20. A memory system according to claim 19, wherein said column decoder means comprises:

spare column selector means for specifying among said spare columns a proper column that replaces a damaged column; and
spare column decoder means connected to said spare column selector means, for potentially activating said proper column before a corresponding address thereof is externally supplied.

21. A device according to claim 20, wherein said spare column decoder means comprises:
means for holding an address of the damaged column, and subtractor means for computing an address preceding that of said damage column by one, and for holding it therein.

22. A memory system according to claim 14, further comprising:
sense amplifiers connected to the columns of said memory cells for generating sensed data signals, said column select lines being coupled to every pair of said sense amplifiers for selecting a first number of neighboring columns simultaneously;
data transfer line means connected to said sense amplifiers for sending forth the outputs of said sense amplifiers; and
said data transfer lines comprises a second number of line segments which include a first group of line segments associated with alternate ones of said columns of said memory cells, and a second group of line segments associated with the rest of said columns of said memory cells, each of the first and second groups of line segments having the first number of parallel line segments.

23. A memory system according to claim 22, wherein said column decoder means allows output signals of two adjacent pairs of sense amplifiers to be developed simultaneously onto said second number of line segments.

24. A memory system according to claim 23, further comprising:
output means connected to said data transfer line means for alternately selecting the sensed data signals on said first group of line segments and those on said second group of line segments, and for serially and externally sending forth the second number of selected data signals.

25. A memory system according to claim 24, further comprising first transfer gate means arranged between said sense amplifiers and said column-select lines, for responding to selection of a column-select line, and for causing two neighboring sense amplifiers to be simultaneously connected with corresponding data transfer line segments of one of said first and second groups of line segments.

26. A memory system according to claim 25, wherein said output means comprises second transfer gate means connected to said data transfer line means, for alternately selecting data signals that appear on said first group of line segments, for alternately selecting data signals appearing on said second group of line segments, and for alternately selecting the selected data signals on said first and second groups of line segments.

27. A memory system according to claim 26, wherein said output means comprises data latch means connected to said second transfer gate means, for temporarily holding said selected data signals therein and sequentially outputting said selected data signals in a predetermined order within a limited period of time.

28. A memory system according to claim 27, wherein said data latch means comprises a first latch circuit connected to said first group of line segments, and a second latch circuit connected to said second group of line segments.

* * * * *